United States Patent
Fukami et al.

(10) Patent No.: US 8,416,611 B2
(45) Date of Patent: Apr. 9, 2013

(54) MAGNETORESISTANCE EFFECT ELEMENT AND MAGNETIC RANDOM ACCESS MEMORY

(75) Inventors: Shunsuke Fukami, Tokyo (JP); Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/665,773

(22) PCT Filed: Jun. 16, 2008

(86) PCT No.: PCT/JP2008/060993
§ 371 (c)(1), (2), (4) Date: Dec. 21, 2009

(87) PCT Pub. No.: WO2009/001706
PCT Pub. Date: Dec. 31, 2008

(65) Prior Publication Data
US 2010/0188890 A1    Jul. 29, 2010

(30) Foreign Application Priority Data
Jun. 25, 2007    (JP) ................. 2007-166079

(51) Int. Cl.
*G11C 11/00*    (2006.01)
*G11C 11/14*    (2006.01)
*H01L 29/82*    (2006.01)

(52) U.S. Cl.
USPC ............. 365/158; 365/171; 257/421

(58) Field of Classification Search ......... 257/421; 365/158, 171
See application file for complete search history.

(56) References Cited

U.S. PATENT DOCUMENTS

| | | | |
|---|---|---|---|
| 5,640,343 A | 6/1997 | Gallagher et al. | |
| 6,055,179 A | 4/2000 | Koganei et al. | |
| 6,545,906 B1 | 4/2003 | Savtchenko et al. | |
| 6,834,005 B1 | 12/2004 | Parkin | |
| 7,532,502 B2 * | 5/2009 | Saito | ............................ 365/158 |

(Continued)

FOREIGN PATENT DOCUMENTS

| | | |
|---|---|---|
| JP | 2001-257395 A | 9/2001 |
| JP | 2003-045010 A | 2/2003 |

(Continued)

OTHER PUBLICATIONS

J.C. Slonczewski, "Current-driven excitation magnetic multilayers", Journal of Magnetism Magnetic Materials, 159, L1-L7, 1996.

(Continued)

*Primary Examiner* — Allison P Bernstein

(57) ABSTRACT

A magnetoresistance effect element includes: a magnetization free layer; a spacer layer provided adjacent to the magnetization free layer; a first magnetization fixed layer provided adjacent to the spacer layer on a side opposite to the magnetization free layer; and at least two second magnetization fixed layers provided adjacent to the magnetization free layer. The magnetization free layer, the first magnetization fixed layer, and the second magnetization free layers respectively have magnetization components in a direction substantially perpendicular to film surfaces thereof. The magnetization free layer includes: two magnetization fixed portions; and a domain wall motion portion arranged between the two magnetization fixed portions. Magnetizations of the two magnetization fixed portions constituting the magnetization free layer are fixed substantially antiparallel to each other in directions substantially perpendicular to the film surface. The domain wall motion portion is provided with magnetic anisotropy in a direction perpendicular to the film surface.

38 Claims, 24 Drawing Sheets

U.S. PATENT DOCUMENTS

| | | | |
|---|---|---|---|
| 7,869,266 B2* | 1/2011 | Ranjan et al. | 365/158 |
| 2002/0167059 A1* | 11/2002 | Nishimura et al. | 257/421 |
| 2006/0237808 A1* | 10/2006 | Saito | 257/421 |
| 2011/0298067 A1* | 12/2011 | Ishiwata et al. | 257/421 |

FOREIGN PATENT DOCUMENTS

| | | | |
|---|---|---|---|
| JP | 2003110094 A | 4/2003 | |
| JP | 2004179183 A | 6/2004 | |
| JP | 2005505889 A | 2/2005 | |
| JP | 2005093488 A | 4/2005 | |
| JP | 2005-123617 A | 5/2005 | |
| JP | 2005150303 A | 6/2005 | |
| JP | 2005-191032 A | 7/2005 | |
| JP | 2005-235250 A | 9/2005 | |
| JP | 2006-073930 A | 3/2006 | |
| JP | 2006093578 A | 4/2006 | |
| JP | 2006-270069 A | 10/2006 | |
| JP | 2006-287081 A | 10/2006 | |
| JP | 2007103663 A | 4/2007 | |
| JP | 2007258460 A | 10/2007 | |
| JP | 2007317895 A | 12/2007 | |
| WO | 2005-069368 A | 7/2005 | |
| WO | 2006-046591 A | 5/2006 | |
| WO | 2007020823 A | 2/2007 | |

OTHER PUBLICATIONS

D.D. Djayaprawira et al., "230% room-temperature magnetoresistance in CoFeB/MgO/CoFeB magnetic tunnel junctions", Applied Physics Letters, vol. 86, 092502, 2005.

D. Ravelosona et al., "Threshold currents to move domain walls in films with perpendicular anisotropy", Applied Physics Letters, vol. 90, 072508, 2007.

H. Numata et al., "Magnetic Configuration of a New Memory Cell Utilizing Domain Wall Motion", Intermag 2006 Digest, HQ-03, 2006, p. 933.

International Search Report for PCT/JP2008/060993 mailed Sep. 22, 2008.

N. Sakimura et al., "MRAM Cell Technology for Over 500MHz SoC", 2006 Symposium on VLSI Circuits, Digest of Technical Papers, pp. 136-137.

A. Yamaguchi et al., "Real-Space Observation of Current-Driven Domain Wall Motion in Submicron Magnetic Wires", Physical Review Letters, vol. 92, No. 7, 077205-1-077205-4 (2004).

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

A. Thiaville et al., "Micromagnetic understanding of current-driven domain wall motion in patterned nanowires", Europhysics Letters, vol. 69 (6), 2005, pp. 990-996.

S. Imada et al., "Perpendicular magnetization of L1o-ordered FePt films in the thinnest limit", Applied Physics Letters 90, 132507-1-132507-3 (2007).

C. Platt et al., "Structural and magnetic properties of CoCrPt perpendicular media grown on different buffer layers", Journal of Magnetism and Magnetic Materials, 247 (2002), 153-158.

* cited by examiner

MAGNETORESISTANCE EFFECT ELEMENT AND MAGNETIC RANDOM ACCESS MEMORY

This application is the National Phase of PCT/JP2008/060993 filed on Jun. 16, 2008, which claims priority based on Japanese patent application No. 2007-166079, filed on Jun. 25, 2007, the entire disclosure of which is incorporated herein by reference.

TECHNICAL FIELD

The present invention relates to a magnetoresistance effect element, and a magnetic random access memory provided with the same as a memory cell.

BACKGROUND ART

Magnetic random access memories (MRAM), which are expected to serve as a nonvolatile memory that can operate at high speed and perform an infinite number of times of rewriting, have been intensively developed. In an MRAM, magnetic material is used as a memory element, and information is memorized as the direction of magnetization of the magnetic material. Several methods are proposed as a method for switching the magnetization of the magnetic material, and all of them are common in use of a current. To put an MRAM into practical use, the reduction in the write current is of much significance; according to 2006 Symposium on VLSI Circuits, Digest of Technical Papers, p. 136, the reduction down to 0.5 mA or less, more preferably, the reduction down to 0.2 mA or less is required.

One of the most popular methods for writing information into the MRAM is a method that arranges an interconnection line used for writing around a magnetic memory element, and switches the direction of magnetization of a magnetic memory element with use of a magnetic field generated by flowing a current through the interconnection line. This method achieves magnetization reversal by the magnetic field, and can therefore, in principle, perform writing in one nanosecond or less; this is preferable for achieving a high speed MRAM. However, a magnetic field for switching magnetization of magnetic material with sufficient thermal stability and resistance against a disturbance magnetic field is typically around several tens of oersteds, and a current of approximately several mili-amperes is required to generate such a magnetic field. In this case, the chip area is inevitably increased, and power consumption necessary for writing is also increased; this results in that the MRAM is inferior to the other random access memories in competitiveness. In addition, when the element is miniaturized, the write current is further increased, which is not preferable also in scaling.

In recent years, the following two approaches are proposed as a method for solving such problems. The first approach is to use spin injection magnetization reversal. This is a method that, in a film stack including a first magnetic layer having reversible magnetization, and a second magnetic layer electrically connected to the first magnetic layer and having fixed magnetization, reverses the magnetization of the first magnetic layer by using the interaction between spin-polarized conduction electrons and localized electrons in the first magnetic layer in the case where a current is flowed between the first and second magnetic layers. The spin injection magnetization reversal occurs at a certain current density or more, and therefore, the current necessary for writing is reduced as the element size is decreased. In other words, the spin injection magnetization reversal method is superior in terms of scaling. In general, however, an insulating layer is provided between the first and second magnetic layers, and a relatively large current should be flowed through the insulating layer in writing; this causes a problem in rewriting resistance or reliability. Also, in general, the write current path and the read current path are same, and therefore undesired writing in reading is also concerned. That is, it can be said that the spin injection magnetization reversal is superior in terms of scaling, but has some barriers for practical application.

The other method is to use the current-driven domain wall motion phenomenon. The magnetization reversal method using the current-driven domain wall motion phenomenon can solve the above-described problems associated with the spin injection magnetization reversal. An MRAM using the current-driven domain wall motion phenomenon is disclosed in, for example, Japanese Laid Open Patent Applications No. P2005-123617A, P2005-191032, P2006-73930A, P2006-270069A, and P2006-287081A. In particular, Japanese Laid Open Patent Application No. P2006-73930A discloses a magnetoresistance effect element including magnetic films each having a magnetization in the thickness direction.

In a typical MRAM using the current-driven domain wall motion phenomenon, magnetizations at both ends of a first magnetic layer having reversible magnetization are fixed so as to be substantially antiparallel to each other. In such magnetization arrangement, a domain wall is introduced in the first magnetic layer. It should be noted that, as reported in Physical Review Letters, vol. 92, No. 7, 077205 (2004), the domain wall moves toward conduction electrons when a current is flowed in the direction in which the current passes through the domain wall, and therefore a writing is achieved by flowing a current through the first magnetic layer. The current-driven domain wall motion also occurs at a certain current density or more, and therefore this method is superior in scaling as is the case of the spin injection magnetization reversal. In addition, it would be understood that the MRAM element using the current-driven domain wall motion phenomenon solves the above problems as described for the spin injection magnetization reversal, since the write current does not flow through the insulating layer, and the write current path and the read current path are separated.

It is concerned, however, that the absolute value of the write current may be relatively large in the MRAM using the current-driven domain wall motion phenomenon. A large number of reports on the observation of current-induced domain wall motion are made besides Physical Review Letters, vol. 92, No. 7, 077205 (2004), and inmost of them, a current density of approximately $1\times10^8$ [A/cm$^2$] is required for domain wall motion. In such a case, the write current is 1 mA for the case where the width and film thickness of the layer in which the domain wall motion occurs are respectively assumed to be 100 nm and 10 nm, for example. The reduction of the write current down to this value or less may be achieved by decreasing the film thickness; however, it is known that the current density necessary for writing is further increased as the film thickness is decreased (see, for example, Japanese Journal of Applied Physics, vol. 45, No. 5A, pp. 3850-3853, (2006)).

Also, to induce the current-driven domain wall motion, a width of the layer in which the domain wall motion occurs should be reduced to a few 10 s nm or less; however, this involves a large difficulty in fabrication technique.

In addition, influences of electron migration and temperature rising may be issues, regarding the use of the current density close to $1\times10^8$ [A/cm$^2$] for the domain wall motion.

DISCLOSURE OF INVENTION

Therefore, an object of the present invention is to provide a magnetoresistance effect element achieving magnetization reversal based on the current-driven domain wall phenomenon, in which the write current is sufficiently reduced and the current density itself is also reduced, and to provide an MRAM using such a magnetoresistance effect element as a memory cell.

In one aspect of the present invention, a magnetoresistance effect element includes: a magnetization free layer; a spacer layer provided adjacent to the magnetization free layer; a first magnetization fixed layer provided adjacent to the spacer layer on a side opposite to the magnetization free layer; and at least two second magnetization fixed layers provided adjacent to the magnetization free layer. The magnetization free layer, the first magnetization fixed layer, and the second magnetization free layers respectively have magnetization components in a direction substantially perpendicular to film surfaces thereof. The magnetization free layer has: two magnetization fixed portions; and a domain wall motion portion arranged between the two magnetization fixed portions. Magnetizations of the two magnetization fixed portions constituting the magnetization free layer are fixed substantially antiparallel to each other in directions substantially perpendicular to the film surface. The domain wall motion portion is provided with magnetic anisotropy in a direction perpendicular to the film surface.

The present invention provides a magnetoresistance effect element achieving magnetization reversal based on the current-driven domain wall phenomenon, in which the write current is sufficiently reduced and the current density itself is also reduced, and provides an MRAM using such a magnetoresistance effect element as a memory cell.

BEST MODE FOR CARRYING OUT THE INVENTION

First Exemplary Embodiment

Configuration of Magnetoresistance Effect Element

Figure 1A:
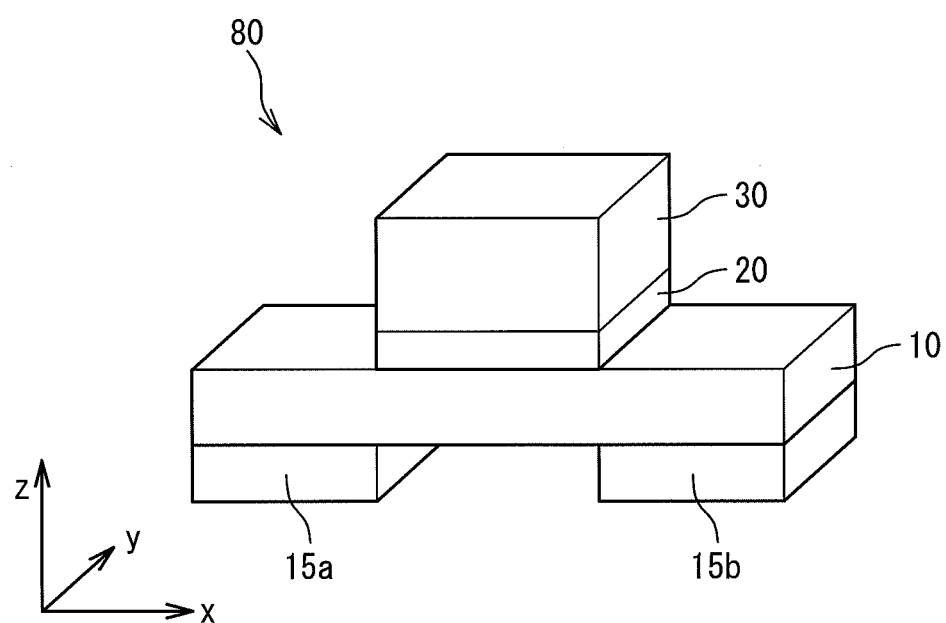
FIG. 1A is a perspective view illustrating a structure of a main part of a magnetoresistance effect element in a first exemplary embodiment of the present invention.
Figure 1B:
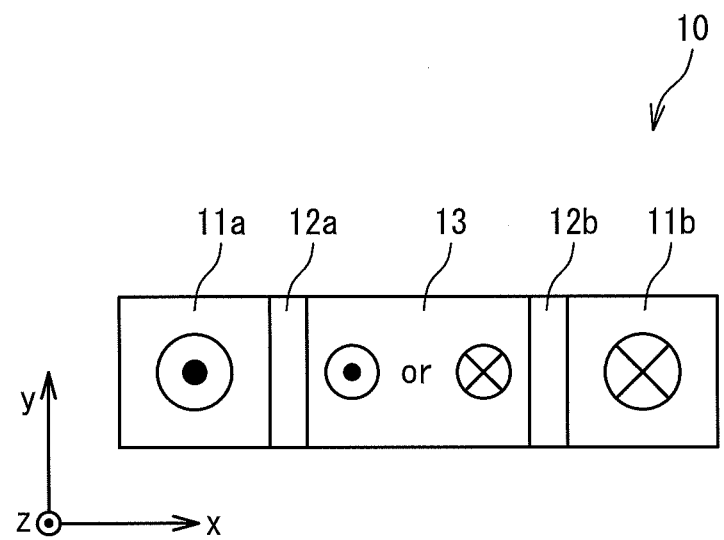
FIG. 1B is a plan view illustrating the structure of the main part of the magnetoresistance effect element in the first exemplary embodiment of the present invention.

FIG. 1A is a perspective view illustrating the configuration of a main portion of a magnetoresistance effect element 80 in a first exemplary embodiment of the present invention. In the following, a description is given with an xyz Cartesian coordinate system defined as illustrated in FIG. 1A. FIG. 1B is an x-y plan view illustrating the configuration of the magnetoresistance effect element 80, and FIG. 1C an x-z cross-sectional view illustrating the configuration of the magnetoresistance effect element 80.

As illustrated in FIG. 1A, the magnetoresistance effect element 80 includes: a magnetization free layer 10 extending in the x direction; a spacer layer 20 provided adjacent to the magnetization free layer 10; a first magnetization fixed layer 30 provided adjacent to the spacer layer 20 on the opposite side of the magnetization free layer 10; and second magnetization fixed layers 15a and 15b provided adjacent to the both ends of the magnetization free layer 10. The spacer layer 20 is sandwiched between the magnetization free layer 10 and the magnetization fixed layer 30. The spacer layer 20 is preferably formed of nonmagnetic insulating material. In this case, the magnetization free layer 10, the spacer layer 20, and the magnetization fixed layer 30 function as a magnetic tunnel junction (MTJ) exhibiting the TMR (tunneling magnetoresistance) effect. The spacer layer 20 may be formed of a conducting or semiconducting material. In this case, the magnetization free layer 10, the spacer layer 20, and the magnetization fixed layer 30 function as a spin valve exhibiting the GMR (giant magnetoresistance) effect.

Figure 1C:
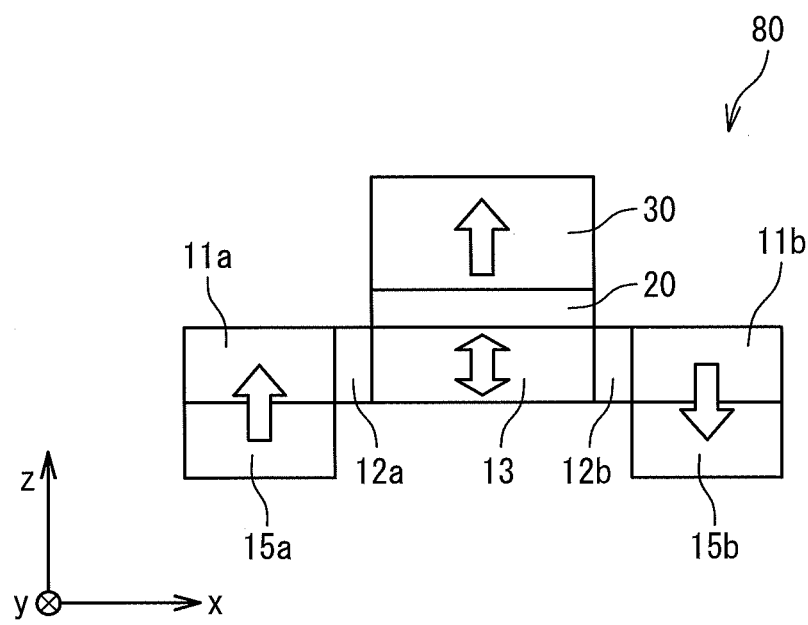
FIG. 1C is a cross-sectional view illustrating the structure of the main part of the magnetoresistance effect element in the first exemplary embodiment of the present invention.

The magnetization free layer 10, the first magnetization fixed layer 30, and the second magnetization fixed layers 15a and 15b are formed of ferromagnetic material. In FIG. 1C, the directions of magnetizations of the magnetization free layer 10, the first magnetization fixed layer 30, and the second magnetization fixed layers 15a and 15b are indicated by arrows. As illustrated in FIG. 1C, the magnetizations of the magnetization free layer 10, the first magnetization fixed layer 30, and the second magnetization fixed layers 15a and 15b are all directed in the direction substantially parallel to the z-axis. To achieve such magnetization directions, the magnetization free layer 10, the first magnetization fixed layer 30, and the second magnetization fixed layers 15 are preferably formed of material or a film stack having perpendicular magnetization. In this case, the stacked film may be formed of multiple ferromagnetic bodies, or of a ferromagnetic body and a nonmagnetic body.

As illustrated in FIG. 1B, the magnetization free layer 10 includes magnetization fixed portions 11a and 11b, domain wall motion portion 13, and domain wall pinning sites 12a and 12b. As illustrated in FIG. 1C, the first magnetization fixed layer 30 is provided so as to overlap with at least a part of the domain wall motion portion 13. The magnetization fixed portions 11a and 11b are adjacently provided with the second magnetization fixed layers 15a and 15b, respectively, and thereby the magnetization directions of the magnetization fixed portions 11a and 11b are fixed in the directions substantially antiparallel to each other. Also, the domain wall motion portion 13 is formed such that the magnetization thereof is reversible between the +z-direction and −z-direction. In this case, the domain wall is formed at any one of the domain wall pinning sites 12a and 12b depending on the magnetization directions of the magnetization fixed portions 11a and 11b and the domain wall motion portion 13. The domain wall pinning site 12a or 12b has a function of stably pinning the domain wall when this system is not applied with any magnetic field or current. It should be noted that it is revealed from a micromagnetic calculation that the structure illustrated in FIGS. 1A to 1C provides natural pinning of the domain wall without a special structure as the domain wall pinning sites 12a and 12b. However, as will be described later, the domain wall pinning sites 12a and 12b may be intentionally designed to further increase the pinning potential.

The magnetization fixed portions 11a and 11b, and the first magnetization fixed layer 30 are electrically connected to different external interconnection lines. It should be note that the magnetization fixed portions 11a and 11b may be electrically connected to the external interconnection lines through the second magnetization fixed layers 15a and 15b. As thus described, the magnetoresistance effect element 80 is a three-terminal element. Also, although not illustrated in FIGS. 1A to 1C, it is desirable that electrode layers for providing contacts with the interconnection lines are additionally provided adjacent to the first magnetization fixed layer 30, and the magnetization free layer 10 or the second magnetization fixed layers 15.

(Writing Method)

Figure 2A:
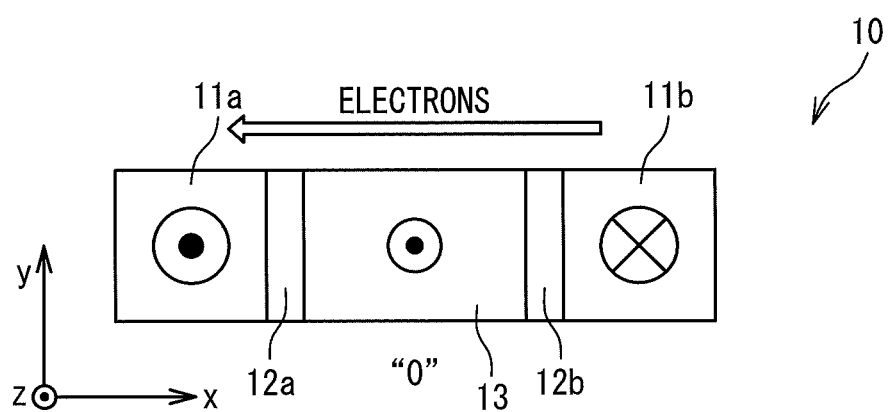
FIG. 2A is a plan view for explaining a method for writing information into the magnetoresistance effect element of the first exemplary embodiment.
Figure 2B:
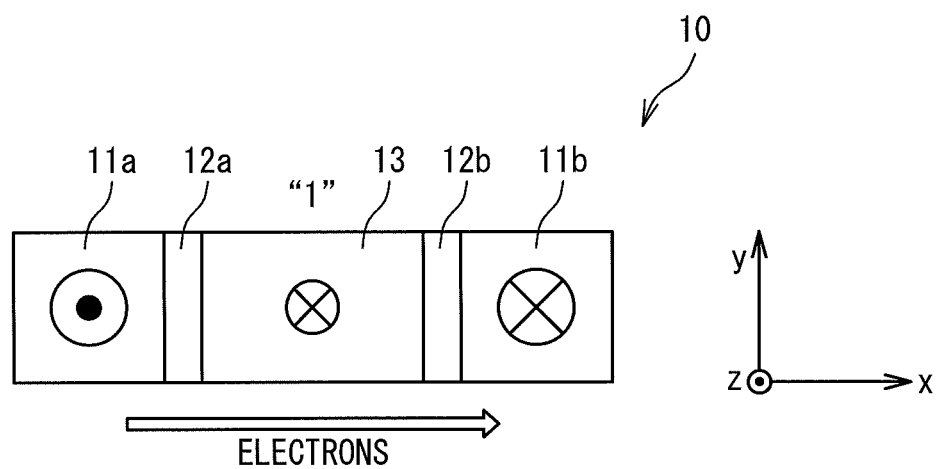
FIG. 2B is a plan view for explaining the method for writing information into the magnetoresistance effect element of the first exemplary embodiment.

A description will be given of a method for writing data into the magnetoresistance effect element 80 with use of FIGS. 2A and 2B. FIGS. 2A and 2B are plan views schematically illustrating two states, i.e., the "0" state and the "1" state into which the magnetoresistance effect element 80 are allowed to be placed. It should be noted that the "0" state refers to a state where data "0" is written into the magnetoresistance effect element 80, and the "1" state refers to a state where data "1" is written into the magnetoresistance effect element 80. The following description is provided on an assumption that, as illustrated in FIGS. 2A and 2B, the magnetizations of the first and second magnetization fixed portions 11a and 11b are fixed in the +z-direction and −z-direction, respectively. In addition, in the following, we define that, the domain wall motion portion 13 is magnetized in the +z-direction (FIG. 2A) in the "0" state, and the domain wall motion portion 13 is magnetized in the −z-direction in the "1" state (FIG. 2B). It should be noted that the magnetization directions of the magnetization fixed portions 11a and 11b are only required to be substantially antiparallel to each other, and not limited to the above-described directions. Also, it goes without saying that the definition associated with the relationship between the data values and the magnetization directions of the domain wall motion portion 13 is not limited to the above-described one.

In the magnetization states as described above, the domain wall is formed at the domain wall pinning site 12b in the "0" state and at the domain wall pinning site 12a in the "1" state. In this exemplary embodiment, the domain wall is moved between the domain wall pinning sites 12a and 12b by changing the direction of the current flowing through the magnetization free layer 10, and thereby desired data are written into the magnetoresistance effect element 80. For example, when the current is flowed in the +x-direction (i.e., conduction electrons are flowed in the −x-direction) with the magnetoresistance effect element 80 placed into the "0" state shown in FIG. 2A, the domain wall at the domain wall pinning site 12b receives a spin transfer torque by the conduction electrons to move in the same direction as the conduction electrons, and then reaches the domain wall pinning site 12a. On the other hand, when the current is flowed in the −x-direction (i.e., the conduction electrons are flowed in the +x-direction) with the magnetoresistance effect element 80 placed into the "1" state shown FIG. 2B, the domain wall at the domain wall pinning site 12a receives a spin transfer torque by the conduction electrons to move to the same direction as the conduction electrons, and then reaches the domain wall pinning site 12b. In this manner, writing from the "0" state to the "1" state, or from the "1" state to the "0" state are achieved.

Also, when the current is flowed in the −x-direction, i.e., the data "0" are written with the magnetoresistance effect element 80 placed into the "0" state illustrated in FIG. 2A, the domain wall is caused to move in the +x-direction; however, the domain wall motion does not occur when the magnetization of the magnetization fixed portion 11b is sufficiently strongly fixed. Accordingly, an overwrite operation (a write operation without reversing the magnetization direction) is also possible. Alternatively, for the case where the magnetization of the magnetization fixed portion 11b is reversed in the +z-direction by the domain wall motion, the overwrite operation as described above is possible if there is provided means that restores the magnetization to an original state, i.e., the state where the magnetization faces in the −z-direction, when the current is switched off. As the restoring means, a magnetic interaction with the second magnetization fixed layer 15 may be used.

(Principle)

In the magnetoresistance effect element 80 of the this exemplary embodiment, one feature is that the layer in which the domain wall motion occurs in data writing (i.e., the domain wall motion portion 13) has magnetic anisotropy in the perpendicular direction; this allows reduction in the write current density. The mechanism thereof is described with use of FIGS. 3A and 3B.

According to Europhysics Letters, vol. 69, 2005, pp. 990-996, the local behavior of magnetization of magnetic material taken in consideration of the spin polarized current is expressed by the following expression (1):

$$\dot{\vec{m}} = \gamma_0 \vec{H} \times \vec{m} + \alpha \vec{m} \times \dot{\vec{m}} - (\vec{u} \cdot \nabla)\vec{m} + \beta \vec{m} \times [(\vec{u} \cdot \nabla)\vec{m}], \quad (1)$$

where m is the local magnetic moment, H is the magnetic field, $\gamma_0$ is the gyro magnetic constant, $\alpha$ is the Gilbert damping constant, $\beta$ is the coefficient of nonadiabatic spin torque term, and u is expressed by the following expression (2):

$$\vec{u} = \frac{P g \mu_B}{2 e M s} \vec{j}, \quad (2)$$

which represents the effective current density. Here, P is the spin polarizability, g is the Lande g factor, $\mu_B$ is the Bohr magneton, e is the elementary charge of electron, Ms is the saturation magnetization, and j is the general current density having a dimension of $[A/m^2]$, and in this case, u is a quantity having a dimension of $[m/s]$. The expression (1) describes the relationship in which the time variation in the magnetization represented by the left-hand side is caused by a plurality of factors described in the right-hand side, and the terms up to the second term of the right hand side correspond to the classical LLG equation. The first, second, third, and fourth terms of the right hand side represent the torque by the magnetic field, the damping, the adiabatic spin torque effect, and the nonadiabatic spin torque effect, respectively. The second, third, and forth terms are hereinafter referred to as the $\alpha$ term, spin torque term, and $\beta$ term, respectively.

Figure 3A:
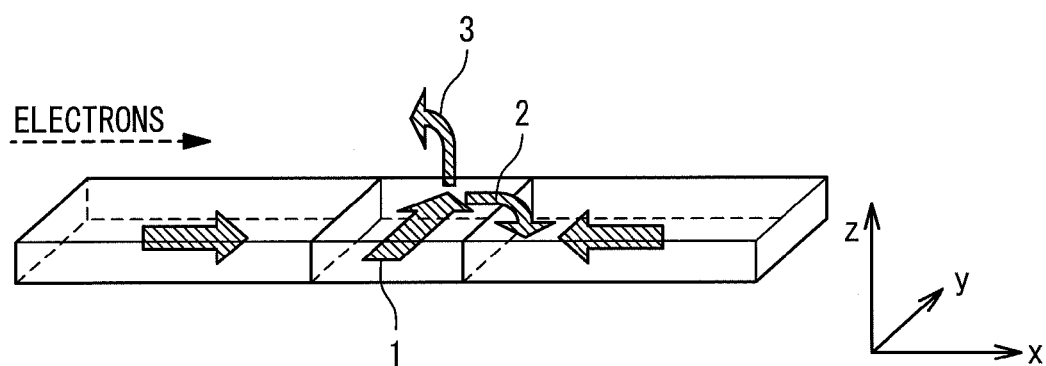
FIG. 3A is a conceptual diagram for explaining superiority of the magnetoresistance effect element of the first exemplary embodiment.

FIG. 3A is a diagram schematically illustrating the torque acting on the domain wall within the magnetic film having a magnetization directed in the in-plane direction (hereinafter referred to as the "in-plane magnetization film"), and FIG. 3B a diagram schematically illustrating the torque acting on the domain wall within the magnetic film having a magnetization directed in the direction perpendicular to the film surface direction (hereinafter referred to as the "perpendicular magnetization film"). For the in-plane magnetization film, as illustrated in FIG. 3A, the magnetic moment 1 in the domain wall is caused to rotate by the spin torque term in the direction indicated by the arrowed line 2 in the diagram, i.e., in the x-y plane, when conduction electrons flow in the direction indicated by the dashed arrowed line. At this time, the magnetic moment 1 in the domain wall is simultaneously caused to rotate in the direction indicated by the arrowed line 3, i.e., in the y-z plane, due to the $\alpha$ and $\beta$ terms. The rotation direction depends on the magnitude relationship between the effects of the $\alpha$ and $\beta$ terms. It should be noted that, in the case where there is no $\beta$ term effect, the rotation direction of the magnetization by the $\alpha$ term is a direction that prevents the domain wall motion, i.e., the rotation in the direction indicated by the arrowed line 2 in the diagram, by the diamagnetic field. This can be interpreted that the energy due to the current comes into balance with the energy generated by the rotation due to the $\alpha$ term in the direction indicated by the arrowed line 3 in the diagram, and thereby the domain wall motion stops. This balance is disrupted by giving the $\beta$ term effect, and at this time, the domain wall motion due to the current is observed (see Europhysics Letters, vol. 69, pp. 990-996 (2005)). That is, it can be said that the domain wall motion in the in-plane magnetization film is $\beta$-term driven.

Figure 3B:
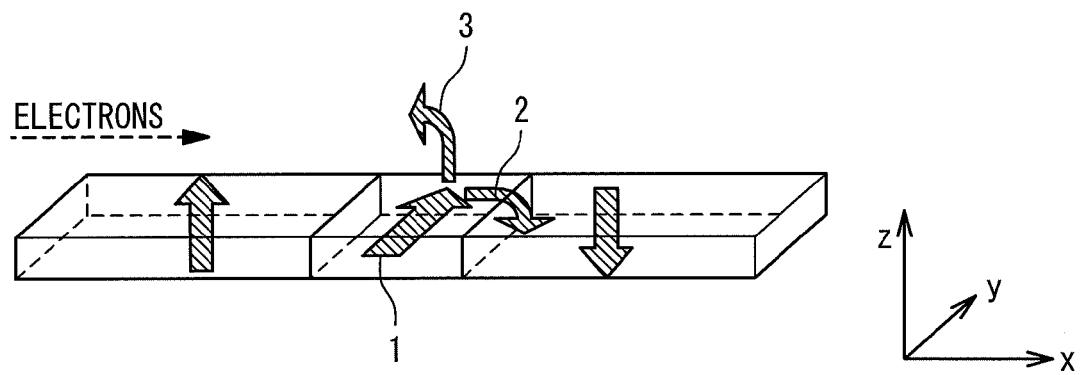
FIG. 3B is a conceptual diagram for explaining the superiority of the magnetoresistance effect element of the first exemplary embodiment.

For the perpendicular magnetization film (FIG. 3B), on the other hand, the magnetic moment 1 in the domain wall is caused to rotate by the spin torque term in the direction indicated by the arrowed line 2 in FIG. 3B, i.e. in the x-z plane. At this time, the magnetic moment 1 is caused to rotate by the $\alpha$ and $\beta$ terms in the direction indicated by the arrowed line 3 in FIG. 3B, i.e., in the x-y plane. The rotational direction is determined depending on the magnitude relationship between the effects of the $\alpha$ and $\beta$ terms. It should be noted that, in the in-plane magnetization film, the rotation by the α term causes an energetically unstable state, and therefore serves as a brake for the domain wall motion, whereas in the perpendicular magnetization film, the increase in the energy caused by the rotation by the α term is extremely small relative to that in the in-plane magnetization film. Accordingly, the magnetic moment in the domain wall can almost freely rotate in the x-y plane by the α and β terms, and as a result, the rotation by the spin torque term in the direction indicated by the arrowed line 3 in FIG. 3 is hardly prevented. That is, it would be understood that an extremely small current allows a domain wall motion by the spin torque term even with in the perpendicular magnetization film.

As described above, the domain wall motion in the in-plane magnetization film is β-term driven, while that in the perpendicular magnetization film can be spin-torque-term driven. In either case, the domain wall motion is possible; however, the spin-torque-term driving is preferable for the case where the domain wall is depinned from a pinning potential having a threshold magnetic field. The situation is illustrated in FIG. 4.

Figure 4:
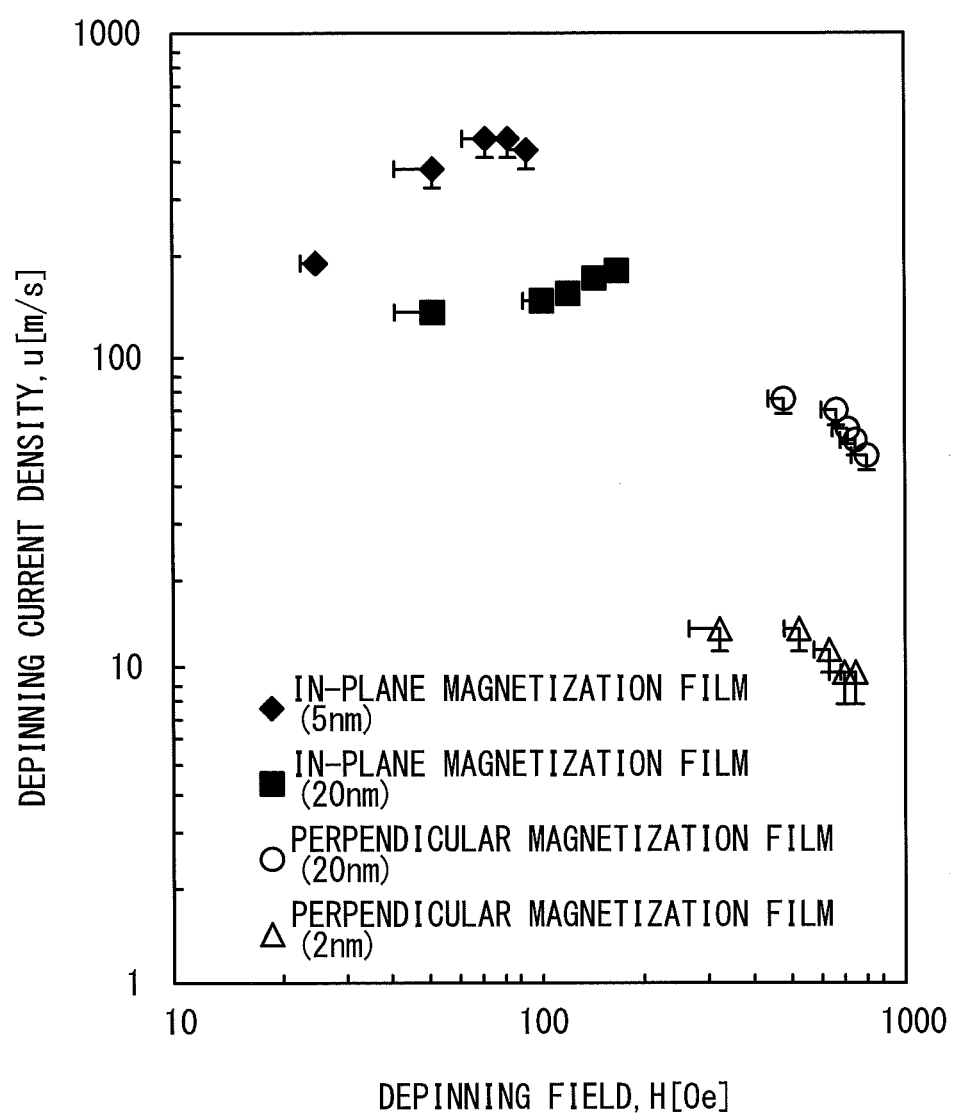
FIG. 4 is a result of calculating relationships between a depinning magnetic field and a depinning current density in an in-plane magnetization film and a perpendicular magnetization film with use of a micromagnetic simulation.

FIG. 4 is a simulation result of a magnetic field (depinning magnetic field: H) and current density (depinning current density: u) necessary for the depinning from some pinning potentials by micromagnetic calculations based on the expression (1). It should be noted that the pinning potentials are formed by providing five types of notches having different sizes in the element. FIG. 4 illustrates calculation results for the in-plane magnetization films having film thicknesses of 5 nm and 20 nm, and perpendicular magnetization films having film thicknesses of 2 nm and 20 nm. As illustrated in FIG. 4, it turns out that the perpendicular magnetization film has a depinning magnetic field approximately one order of magnitude larger as compared with the in-plane magnetization film, while having a depinning current density approximately one order of magnitude smaller. This is preferable for manufacturing an MRAM having a high thermal stability and resistance against the disturbance magnetic field with a reduced write current density.

Figure 5:
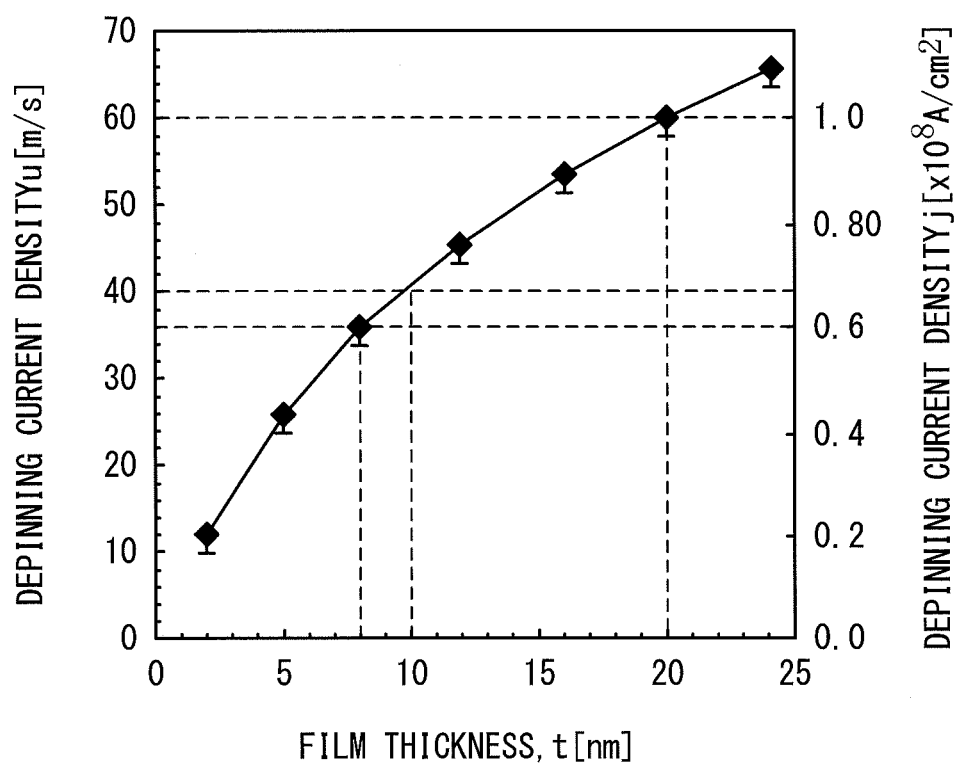
FIG. 5 is a calculation result of a film thickness dependence of the depinning current density of the perpendicular magnetization film.

Also, referring to FIG. 4 in detail, it turns out that the current density necessary for the depinning increases as the film thickness is decreased in the in-plane magnetization film, whereas it decreases as the film thickness is decreased in the perpendicular magnetization film. A result of more detailed examination of this fact is illustrated in FIG. 5. As is apparent from FIG. 5, it turns out that, the current necessary for the depinning relatively largely decreases as the film thickness is decreased in the case of the perpendicular magnetization film. The inventor have found on the basis of the micromagnetic calculations that this phenomenon results from the fact that the difference in the magnetic anisotropy acting on the magnetic moment 1 in the domain wall between the line width direction and the film surface perpendicular direction increases as the film thickness is decreased in the in-plane magnetization film, whereas in the perpendicular magnetization film, the difference between the line width direction and the thin line longitudinal direction decreased as the film thickness is decreased. When the film thickness of the magnetization free layer is decreased, the absolute value of current necessary for writing decreases; in addition, the reduction in the film thickness of the perpendicular magnetization film results in the reduction in the write current density, and therefore it can be said also in this aspect that the perpendicular magnetization film is superior to the in-plane magnetization film.

It should be noted that, in FIG. 5, the vertical axis on the left-hand side indicates values of current densities u defined by the expression (2), and the vertical axis on the right-hand side indicates values of current densities for the case of $M_s$=500 [emu/cm$^3$] and P=0.5. In general, in the case of using a current density of $1 \times 10^8$ [A/cm2] or more, influences such as electron migration become apparent, and therefore the application of such current density to a memory cell of an MRAM is impractical. Referring to FIG. 5, the current density necessary for the depinning is $1 \times 10^8$ [A/cm$^2$] or less at the film thickness of 20 nm or less, and therefore the film thickness of the magnetization free layer 10 is preferably 20 nm or less in manufacturing a domain wall motion type MRAM using a perpendicular magnetization film.

Figure 6:
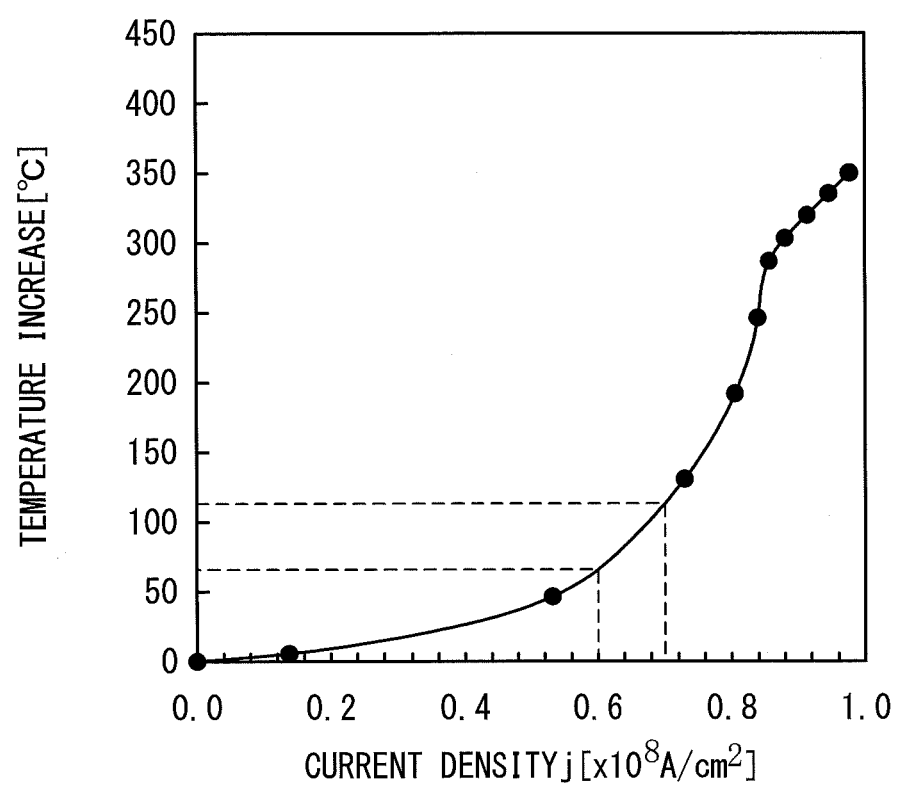
FIG. 6 is a measurement result of a current density dependence of a temperature increase.

When the write current density is large, influences of heat generation and the like are also concerned in addition to the electron migration. FIG. 6 is a result of an estimation of the temperature increase caused by the application of a current to magnetic material obtained by measuring the resistance increase. The temperature increase in writing into the MRAM is preferably 120° C. or less, and more preferably 60° C. or less, considering the operation guarantee temperature, reliability of the MTJ, and lifetime of the element. Referring to FIG. 6, the temperature increases of 120° C. and 60° C. respectively correspond to the current densities of approximately $0.7 \times 10^8$ [A/cm$^2$] and $0.6 \times 10^8$ [A/cm$^2$], and it is understood from FIG. 5 that the film thickness ranges enabling the depinning at such current densities are respectively 10 nm or less, and 8 nm or less. That is, the film thickness of the magnetization free layer 10 is preferably 10 nm or less, and more preferably 8 nm or less.

It is also preferable that the film thickness of the magnetization free layer 10 is approximately 1 nm or more. This is because stable perpendicular magnetization cannot be maintained at room temperature (see Applied Physics Letters, vol. 90, 132507 (2007)) when the film thickness is 1 nm or less.

(Reading Method)

Figure 7A:
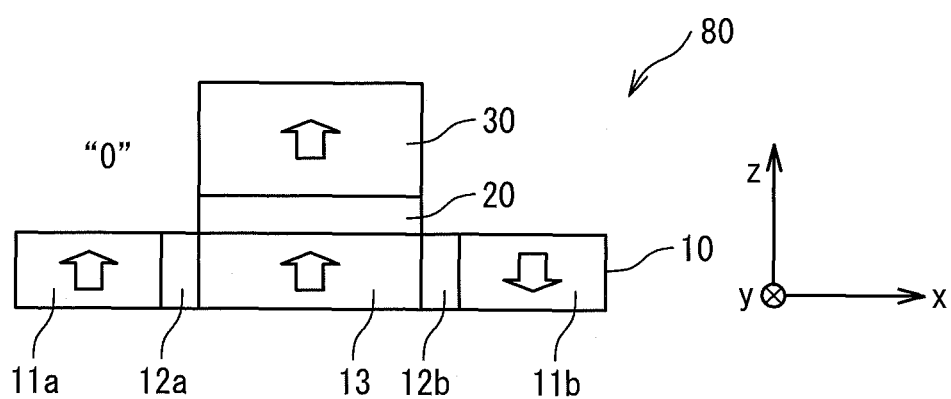
FIG. 7A is a cross-sectional view for explaining a method for reading data from the magnetoresistance effect element of the first exemplary embodiment.
Figure 7B:
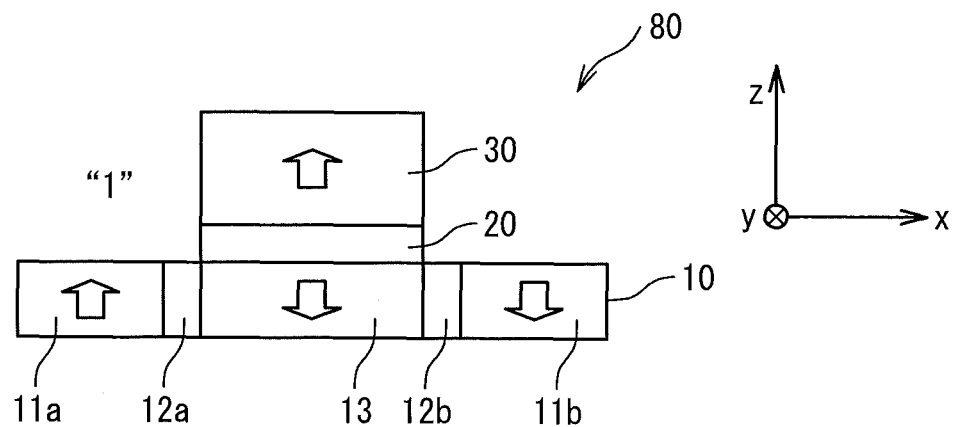
FIG. 7B is a cross-sectional view for explaining the method for reading data from the magnetoresistance effect element of the first exemplary embodiment.

Next, a description is given of data reading from the magnetoresistance effect element 80 of this exemplary embodiment with use of FIGS. 7A and 7B. In the present exemplary embodiment, as has been described, data are memorized as the magnetization direction of the domain wall motion portion 13, and the domain wall motion portion 13 is connected to the first magnetization fixed layer 30 through the spacer layer 20. The magnetoresistance effect is used for the data reading from the magnetoresistance effect element 80. The magnetoresistance effect causes a change in the resistance value of the magnetic tunnel junction (or spin valve) including the magnetization free layer 10, the spacer layer 20, and the first magnetization fixed layer 30 depending on the magnetization direction of the domain wall motion portion 13. Accordingly, data can be read by flowing a current between the magnetization free layer 10 and the first magnetization fixed layer 30. As illustrated in FIG. 7A, for example, a low resistance state is achieved when the magnetization direction of the domain wall motion portion 13 in the magnetization free layer 10 and the magnetization direction of the first magnetization fixed layer 30 are parallel to each other, whereas, as illustrated in FIG. 7B, a high resistance state is achieved when the magnetization direction of the domain wall motion portion 13 and the magnetization direction of the first magnetization fixed layer 30 are antiparallel to each other.

Advantages of Magnetoresistance Effect Element of First Exemplary Embodiment

The magnetoresistance effect element 80 of this exemplary embodiment is superior in the thermal stability and the disturbance magnetic field resistance; only requires a reduced current for writing; and is further superior in terms of scaling. This is because the magnetization direction of the magnetization free layer 10 is directed in the perpendicular direction, and the thickness thereof is reduced. In the following, characteristics of the elements in a magnetic random access memory that uses the in-plane magnetization film and performs writing based on the domain wall motion, and a magnetic random access memory that uses the perpendicular magnetization film and performs writing based on the domain wall motion are approximately calculated and compared with each other, and the results will be described.

First, for the domain wall motion element using the in-plane magnetization film, the element width (w), the film thickness (t), the half of the width of the pinning sites for the domain wall ($q_0$), the saturation magnetization ($M_s$), the spin polarizability (P), and the threshold magnetic field of the pinning site for the domain wall ($H_c$) are respectively assumed to be 100 nm, 10 nm, 40 nm, 800 [emu/cm$^3$], 0.7, and 50 [Oe]. For the domain wall motion element using the perpendicular magnetization film, on the other hand, the element width (w), the film thickness (t), the half of the width of the pinning sites for the domain wall ($q_0$), the saturation magnetization ($M_s$), the spin polarizability (P), and the threshold magnetic field of the pinning site for the domain wall ($H_c$) are respectively assumed to be 100 nm, 2 nm, 15 nm, 500 [emu/cm$^3$], 0.5, and 1000 [Oe]. It should be noted that the values of the pinning site widths are ones obtained by using micromagnetic simulations.

In the case of assuming the values as described above, the magnitude ($\Delta E$) of an energy barrier of the system can be approximately calculated as $M_s H_c q_0 wt$, and as a result, $\Delta E/k_B T$, which serves as a thermal stability index, is 40 for both of the in-plane and the perpendicular magnetization films. Here, $k_B$ is the Boltzmann constant, and T the absolute temperature.

The depinning current density of the in-plane magnetization film having a film thickness of 10 nm and the threshold magnetic field of 50 Oe can be read as u=300 [m/s] from FIG. 4, which corresponds to approximately 6×10$^8$ [A/cm$^2$]. Principally, it is impractical to flow such current density from the perspectives of heat generation and electron migration effect; however, we here use the value for comparison. In this case, the write current into the element with the in-plane magnetization film is 6 [mA].

On the other hand, the depinning current density for the case of the perpendicular magnetization film having a film thickness of 2 nm and the threshold magnetic field of 1000 Oe can be read as u=10 [m/s] from FIG. 4, which corresponds to approximately 2×10$^7$ [A/cm$^2$]. In this case, the write current into the element is 0.04 [mA]. As described, it turns out that by using the perpendicular magnetization film for the magnetization free layer 10, a large reduction in the write current is achieved.

It should be noted that the parameters used here are only rough measures, and therefore other values can also be used. Accordingly, the current value necessary for writing, and thermal stability $\Delta E/k_B T$ vary in accordance with the varied parameters; however, the current value and the thermal stability vary basically in conjunction with each other, and therefore the magnitude relationship in the write current between the in-plane magnetization film and the perpendicular magnetization film as described above is not reversed.

Also, in general, a magnetic shield and the like should be provided in manufacturing an MRAM; however, in the case of using the perpendicular magnetization film, the magnetic shield can be omitted, resulting in cost reduction. This is because a general perpendicular magnetization film has a sufficiently large crystalline magnetic anisotropy, and therefore has extremely large resistance to the disturbance magnetic field as compared with the in-plane magnetization film.

In the magnetoresistance effect element 80 of this exemplary embodiment, the current density necessary for writing can be decreased by reducing the film thickness. Accordingly, the magnetoresistance effect element 80 of this exemplary embodiment reduces the influence of heat generation to thereby expand the operation guarantee temperature range by reducing the film thickness, and therefore dramatically improves the lifetime and reliability thereof.

Figure 8:
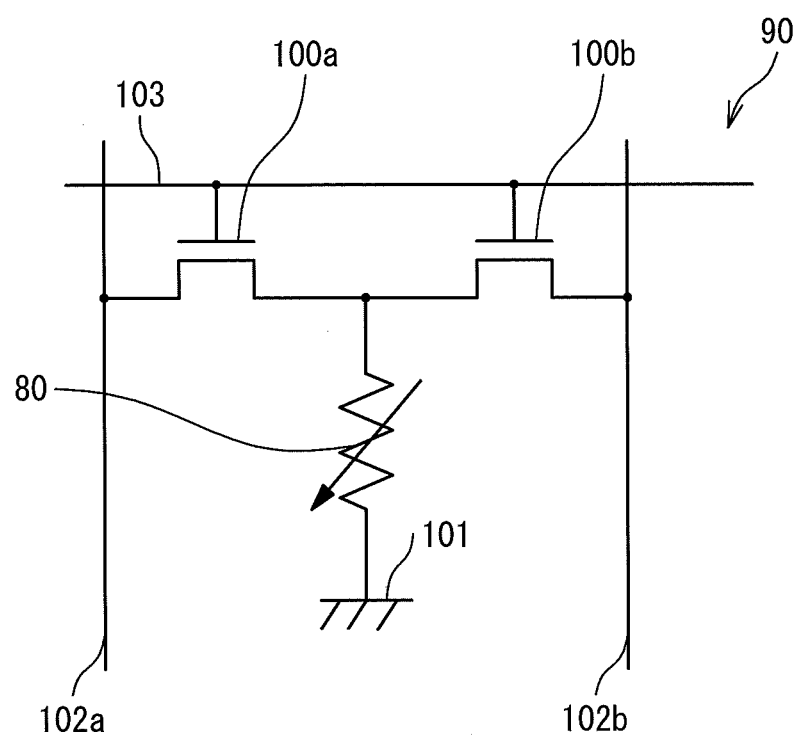
FIG. 8 is an example of a circuit diagram of one magnetic memory cell.
Figure 9:
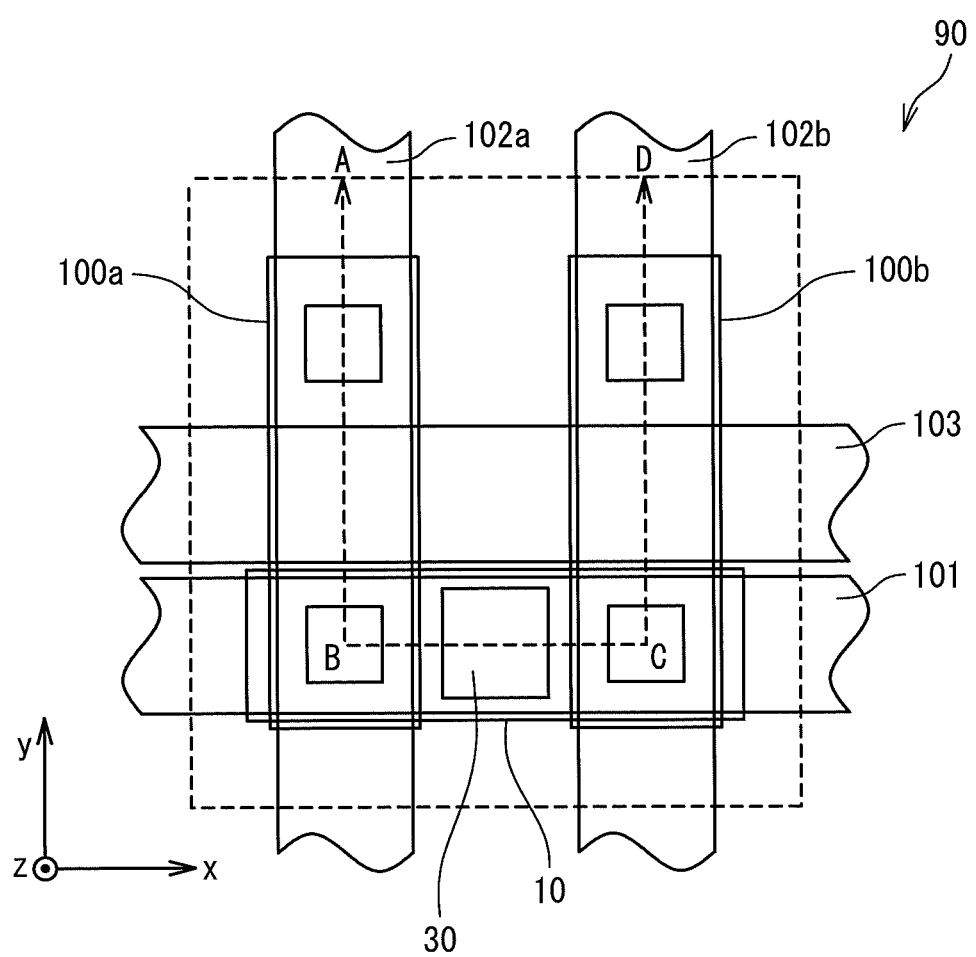
FIG. 9 is a plan view illustrating an example of a layout of the magnetic memory cell.
Figure 10:
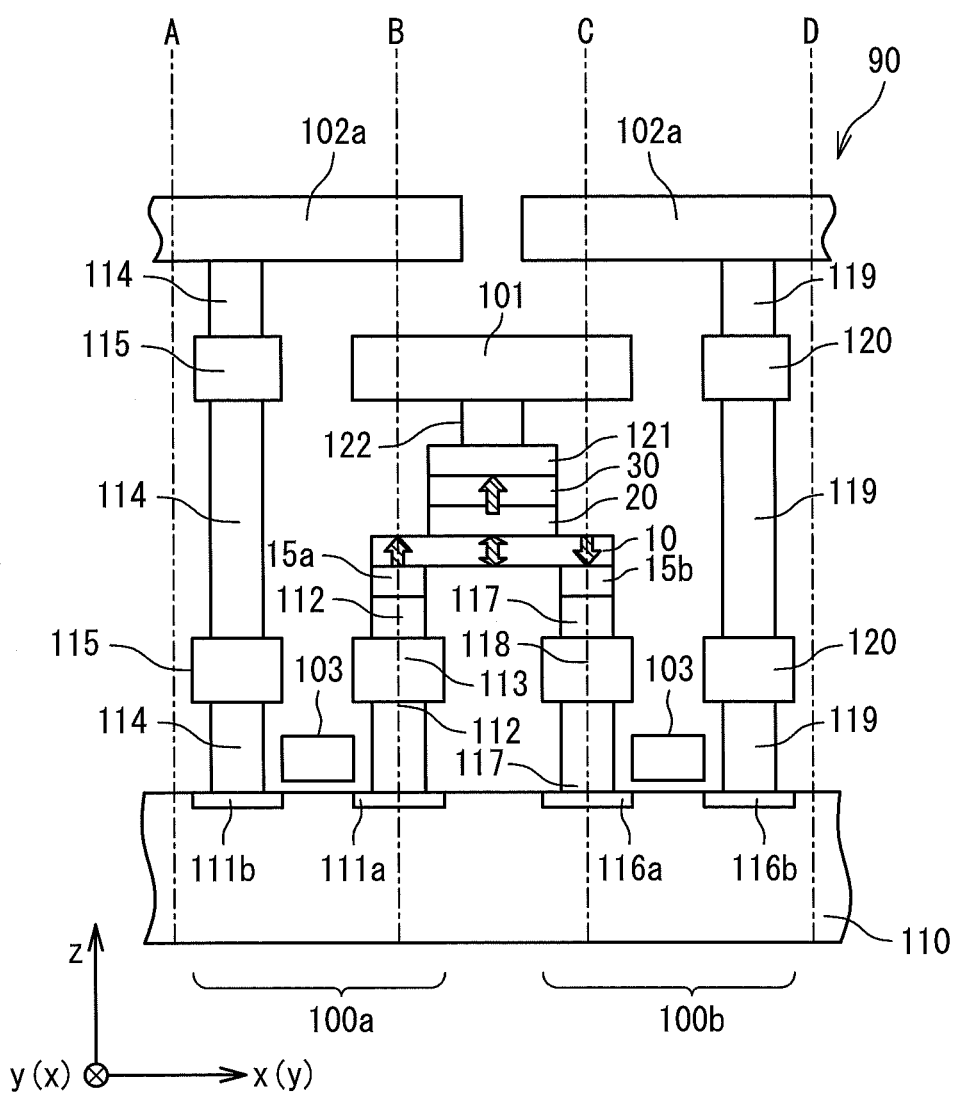
FIG. 10 is a cross-sectional view illustrating the example of the layout of the magnetic memory cell according to the present invention.

Next, a description is given of a circuit configuration and layout of a magnetic memory cell 90 configured with use of the magnetoresistance effect element 80 of this exemplary embodiment with use of FIGS. 8, 9, and 10.

FIG. 8 illustrates an example of the circuit configuration of one magnetic memory cell 90. As described above, the magnetoresistance effect element 80 is a three-terminal element; one terminal is connected to the first magnetization fixed layer 30 is connected to a ground line 101 for reading, and the other two terminals connected to the both ends of the magnetization free layer 10 are respectively connected to first source/drain of two transistors 100a and 100b. Also, second source/drain of the transistors 100a and 100b are connected to write bit lines 102a and 102b, and gate electrodes are connected to a word line 103. Further, the magnetic memory cells 90 illustrated in FIG. 8 are arranged in an array, and connected to peripheral circuits, on the basis of which a magnetic random access memory is configured.

Next, a description is given of write and read operations of the magnetic memory cell 90 illustrated in FIG. 8. In writing, the word line 103 is switched "high", and transistors 100a and 100b are turned "ON". Also, any one of the bit lines 102a and 102b is switched "high", and the other one is switched "low". The direction of current flowing through the magnetization free layer 10 varies depending on which one of the bit lines 102 is switched "high" or "low", and this allows data writing into the magnetoresistance effect element 80.

In reading, the word line 103 is switched "high", and transistors 100a and 100b are turned "ON". Also, one of the bit lines 102a and 102b is switched "high", and the other one is switched "open". At this time, the current passing through the magnetoresistance effect element 80 from the any one of the bit lines 102a and 102b flows to the ground line 101, and this allows high speed reading based on the magnetoresistance effect. It should be noted that the circuit illustrated in FIG. 8 and the circuit settings described here are only an example of a method for carrying out the present invention, and therefore the present invention can also be carried out on the basis of the other circuit configuration.

The magnetic memory cell 90 having the circuit configuration illustrated in FIG. 8 may be implemented with a layout illustrated in FIGS. 9 and 10. FIG. 9 is an x-y plan view illustrating an example of the layout of the magnetic memory cell 90, and FIG. 10 is a cross-sectional view illustrating the configuration in the A-B-C-D cross-section of FIG. 9. As illustrated in FIG. 10, the NMOS transistors 100a and 100b are provided for a substrate 100. As illustrated in FIG. 9, the gates of the NMOS transistors 100a and 100b are provided to extend in the y-axis direction, and used as the word line 103. Referring back to FIG. 10, one source/drain 111a of the NMOS transistor 100a is connected to the magnetization fixed layer 15a through a contact 112 and an interconnection layer 113, and the other source/drain 111b is connected to the bit line 102a through a contact 114 and an interconnection layer 115. On the other hand, one source/drain 116a of the NMOS transistor 100b is connected to the magnetization fixed layer 15b through a contact 117 and an interconnection layer 118, and the other source/drain 116b is connected to the bit line 102b through a contact 119 and an interconnection layer 120. As illustrated in FIG. 9, the bit lines 102a and 102b are provided to extend in the y-axis direction.

Referring back to FIG. 10, formed on the magnetization fixed layer 30 of the magnetoresistance effect element 80 is an electrode layer 121, which is connected to the ground line 101 through a contact 122. As illustrated in FIG. 9, the ground line 101 is provided to extend in the x-axis direction. Such layout is preferable for reducing the area of the magnetic memory cell 90.

It should be noted that the layout illustrated here is merely an example, and therefore the magnetic memory cell 90 may be formed with other layouts. For example, in FIGS. 9 and 10, the NMOS transistors 100a and 100b are arranged in the y-axis direction; however, the NMOS transistors 100a and 100b may be arranged in the x-axis direction. In this case, the word line 103 is desirably formed with projections so as to be connected to the gates of the NMOS transistors 100a and 100b.

(Method for Fixing Magnetizations of Second Magnetization Fixed Layers 15a and 15b)

In the magnetoresistance effect element 80 of this exemplary embodiment, the magnetizations of the magnetization fixed portions 11a and 11b of the magnetization free layer 10 are fixed substantially antiparallel to each other in the film surface perpendicular directions. Such magnetization fixation can be achieved by the second magnetization fixed layers 15a and 15b provided adjacent to the magnetization fixed portions 11a and 11b. We here describe a method for fixing the magnetizations of the magnetization fixed portions 11a and 11b by using the second magnetization fixed layers 15a and 15b.

FIGS. 11A to 11F are explanatory diagrams about the method for fixing the magnetizations of the magnetization fixed portions 11a and 11b by the second magnetization fixed layers 15a and 15b. Any of the magnetization fixing methods described here is based on an approach that provides the difference in the coercive force between the second magnetization fixed layers 15a and 15b; first aligns the directions of the magnetizations of the both second magnetization fixed layers 15a and 15b by applying a sufficiently large magnetic field; and then reverses only one of the second magnetization fixed layers 15a and 15b by applying a magnetic field of an appropriate intensity. That is, any of the six methods illustrated in FIGS. 11A to 11F is a specific method for providing the difference in coercive force between the one second magnetization fixed layer 15a and the other second magnetization fixed layer 15b.

Figure 11A:
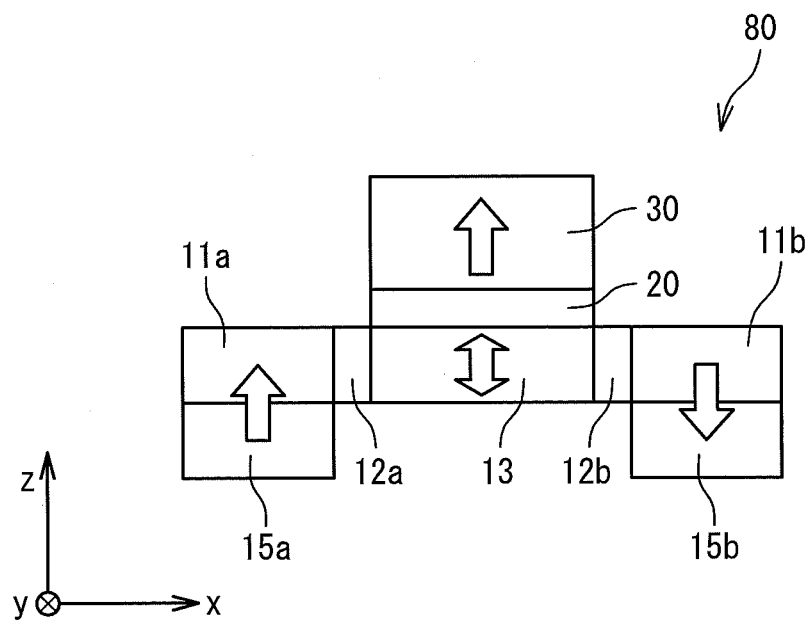
FIG. 11A is a cross-sectional view illustrating a configuration example of a second magnetization fixed layer in the magnetoresistance effect element of the first exemplary embodiment.

Among them, FIG. 11A is an example where the one second magnetization fixed layer 15a and the other second magnetization fixed layer 15b are formed of different materials. It should be noted that a difference in coercive force is provided between the two different materials. This can be achieved by the difference in constituent element or composition, or by the difference in structure such as a crystal structure, defect structure, or textural factor.

Figure 11B:
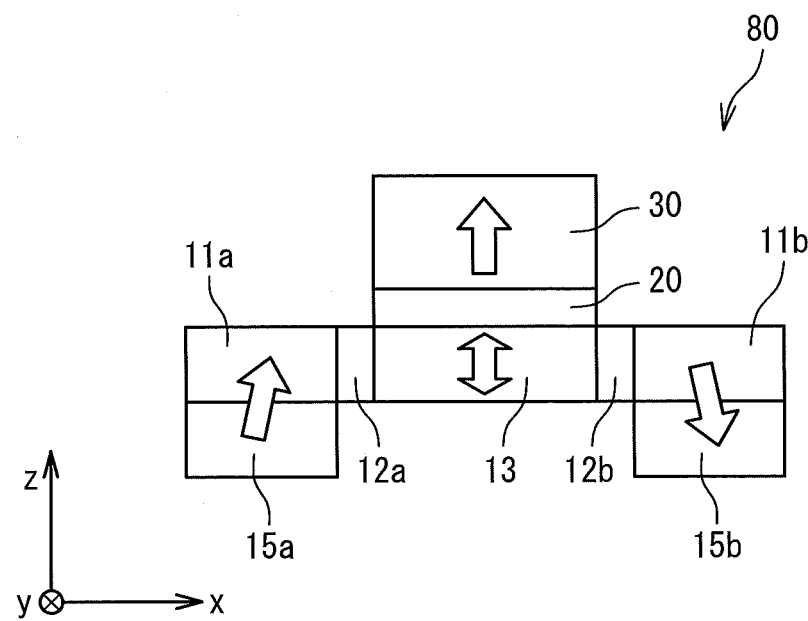
FIG. 11B is a cross-sectional view illustrating a configuration example of the second magnetization fixed layer in the magnetoresistance effect element of the first exemplary embodiment.

Also, FIG. 11B is an example where the one second magnetization fixed layer 15a and the other second magnetization fixed layer 15b are formed to have different easy magnetization axis directions. In this case, substantially antiparallel states can be achieved as the magnetization states of the second magnetization fixed layers 15a and 15b by aligning the directions of the magnetization of the both second magnetization fixed layers 15a and 15b in substantially the same direction, and then applying a magnetic field in the direction so that the magnetization of only one of the second magnetization fixed layers is reversed. Such a difference in easy magnetization axis can be achieved on the basis of crystal magnetic anisotropy, or shape magnetic anisotropy.

Figure 11C:
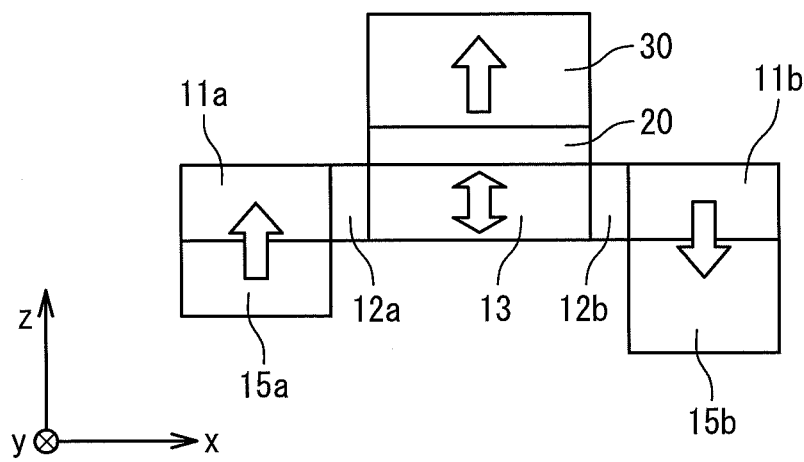
FIG. 11C is a cross-sectional view illustrating a configuration example of the second magnetization fixed layer in the magnetoresistance effect element of the first exemplary embodiment.

FIG. 11C is an example where the one second magnetization fixed layer 15a and the other second magnetization fixed layer 15b are formed to have different film thicknesses. In this case, the one second magnetization fixed layers 15b is provided to have a thicker film thickness as compared with the other second magnetization fixed layer 15a, and in general, a magnetization fixed layer having a thicker film thickness has a larger coercive force in the perpendicular direction. Accordingly, the two step magnetization process as described above allows achieving the substantially antiparallel states as the magnetization states of the second magnetization fixed layers 15a and 15b.

Figure 11D:
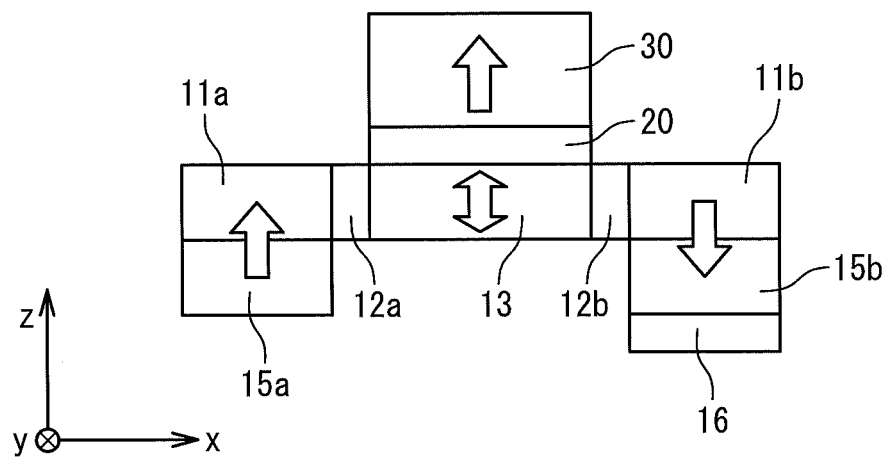
FIG. 11D is a cross-sectional view illustrating a configuration example of the second magnetization fixed layer in the magnetoresistance effect element of the first exemplary embodiment.

FIG. 11D is an example where a pinning layer 16 is provided adjacent to one of the second magnetization fixed layers 15a and 15b (in the case of FIG. 11D, the second magnetization fixed layer 15b). Antiferromagnetic material may be used as material of the pinning layer 16, besides ferromagnetic material having large magnetic anisotropy. This also provides the difference in the effective coercive force, and therefore the two step magnetization process as described above allows providing substantially antiparallel states as the magnetization states of the second magnetization fixed layers 15a and 15b. Is should be noted that, in FIG. 11D, the pinning layer 16 is provided in contact with the surface of the magnetization fixed layer 15b on the opposite side of the magnetization free layer 10; however, in practice, the pinning layer 16 is only required to be in contact with the second magnetization fixed layer 15b, and therefore the position thereof may be arbitrarily determined.

Figure 11E:
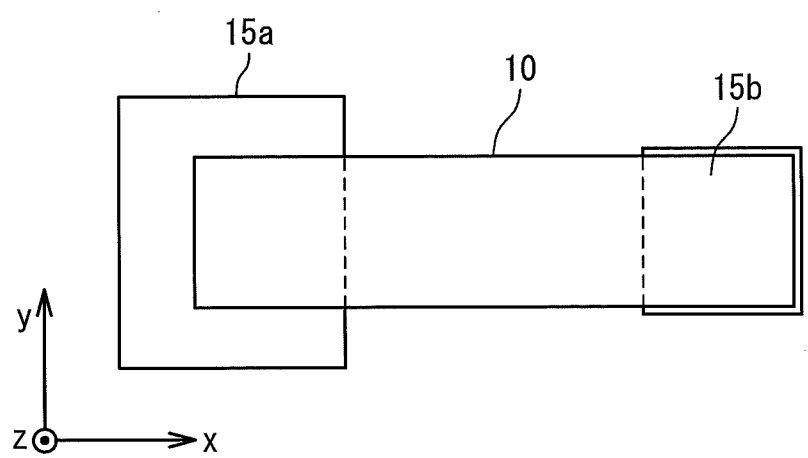
FIG. 11E is a plan view illustrating a configuration example of the second magnetization fixed layer in the magnetoresistance effect element of the first exemplary embodiment.

FIG. 11E is an example where the two second magnetization fixed layers 15a and 15b are formed to have different areas in the x-y plane. As a result of micromagnetic calculations, it turned out that the reversal magnetic field is decreased as the area in the x-y plane increases. Accordingly, the coercive force of one of the second magnetization fixed layers (in the case of FIG. 11E, the second magnetization fixed layer 15a) is smaller than the coercive force of the other second magnetization fixed layer (in the diagram, the second magnetization fixed layer 15b), and therefore the two step magnetization process as described above allows providing the substantially antiparallel states as the magnetization states of the second magnetization fixed layers 15a and 15b.

Figure 11F:
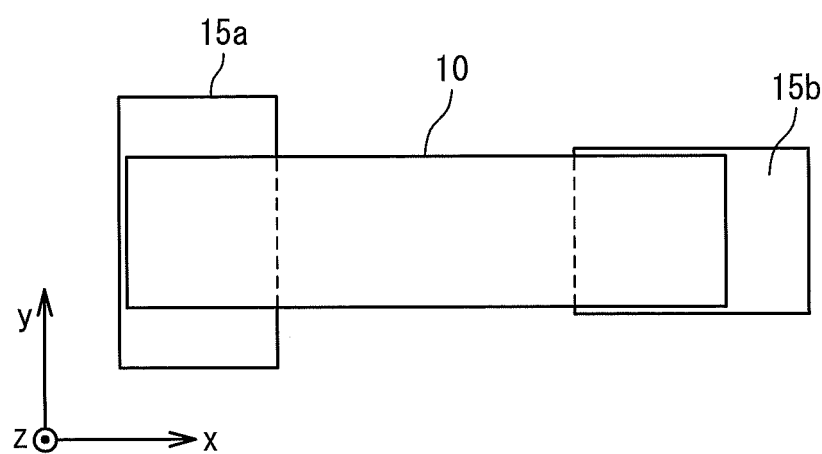
FIG. 11F is a cross-sectional view illustrating a configuration example of the second magnetization fixed layer in the magnetoresistance effect element of the first exemplary embodiment.

FIG. 11F is an example where at least one of the second magnetization fixed layers 15a and 15b is patterned in an anisotropic shape in the x-y plane. In this case, the two step magnetization process as described above allows providing the substantially antiparallel states as the magnetization states of the second magnetization fixed layers 15a and 15b, by applying a magnetic field in the direction in the x-y plane in addition to a magnetic field in the z-axis direction in FIG. 11F. According to micromagnetic calculations, it turned out that the coercive force is decreased in magnetic material having perpendicular magnetic anisotropy and anisotropic shape by applying a magnetic field in the longitudinal axis direction of the magnetic material with respect to the perpendicular direction, rather than by applying a magnetic field in the shorter axis direction. In the case of FIG. 11F, the one second magnetization fixed layer 15a has a longer axis in the y-axis direction, whereas the other second magnetization fixed layer 15b has a longer axis in the x-axis direction, and therefore only the magnetization of the second magnetization fixed layer 15b can be reversed for example, by substantially aligning the magnetizations of the second magnetization fixed layers 15a and 15b both in the +z-direction first, and then applying a magnetic field of an appropriate intensity having a −z-direction component and an x-axis direction component.

It should be noted that, although illustrated as a rectangular shape, the shape of the second magnetization fixed layer 15 may be any shape which has anisotropy in the x-y plane.

Also, although not illustrated, the difference in the effective coercive force can be provided also by providing three or more second magnetization fixed layers 15. Further, the substantially antiparallel states may be achieved as the magnetization states of the second magnetization fixed layers 15a and 15b by providing the difference in the coercive force between the second magnetization fixed layers 15a and 15b through a method other than those described above. Still further, the above-described six methods may be used in combination.

(Materials)

Materials of the respective layers constituting the magnetoresistance effect element 80 are exemplified here. It should be noted that the materials described here are all examples, and in practice, any materials may be used if the magnetization states as illustrated in FIGS. 1A to 1C are achieved.

Tables 1 and 2 illustrate results of micromagnetic simulations about ranges of material characteristics of the second magnetization fixed layer 15 and magnetization free layer 10, which can achieve the magnetization states as illustrates in FIGS. 1A to 1C. Specifically, Table 1 illustrates an allowed range of characteristics of material constituting the second magnetization fixed layer 15, and Table 2 an allowed range of characteristics of material constituting the magnetization free layer 10. In both of Tables 1 and 2, the sections with the symbols "○" mean a range achieving the magnetization states as in FIGS. 1A to 1C, whereas the sections with the symbols "x" mean a range not achieving the magnetization states as in FIGS. 1A to 1C. More specifically, for Table 1, it turned out that the ranges corresponding to the sections with the symbols "x" lead to not a single domain structure in which the second magnetization fixed layer 15 is almost uniformly magnetized in the perpendicular direction, but a multi-domain structure. For Table 2, it turned out that the ranges corresponding to the sections with the symbols "x" results in that the magnetization of at least a portion of the magnetization free layer 10 is not directed in the perpendicular direction, but in the in-plane direction. It should be noted that Tables 1 and 2 illustrate the results of examinations of the saturation magnetization ($M_s$) and the magnetic anisotropy constant in the perpendicular direction ($K_u$).

TABLE 1

| | Ms [emu/cm³] | | | | |
| --- | --- | --- | --- | --- | --- |
| | 400 | 800 | 1200 | 1600 | 2000 |
| Ku [×10⁶ erg/cm³] 1 | ○ | X | X | X | X |
| 5 | ○ | ○ | X | X | X |
| 10 | ○ | ○ | ○ | X | X |
| 20 | ○ | ○ | ○ | ○ | X |
| 40 | ○ | ○ | ○ | ○ | ○ |

TABLE 2

| | Ms [emu/cm³] | | | | |
| --- | --- | --- | --- | --- | --- |
| | 400 | 800 | 1200 | 1600 | 2000 |
| Ku [×10⁶ erg/cm³] 1 | X | X | X | X | X |
| 2 | ○ | X | X | X | X |
| 4 | ○ | ○ | X | X | X |
| 6 | ○ | ○ | ○ | X | X |
| 8 | ○ | ○ | ○ | ○ | X |

First, it is understood from Table 1 that the magnetization states illustrated in FIGS. 1A to 1C can be achieved in the second magnetization fixed layers 15a and 15b, when the saturation magnetization ($M_s$) is small, and the magnetic anisotropy constant in the perpendicular direction ($K_u$) is large. In particular, it is understood that the magnetization states illustrated in FIGS. 1A to 1C can be achieved, when the saturation magnetization ($M_s$) is 1200 [emu/cm³] or less and the magnetic anisotropy constant in the perpendicular direction ($K_u$) is $1 \times 10^7$ [erg/cm³] or more, or when the saturation magnetization ($M_s$) is 800 [emu/cm³] or less and the magnetic anisotropy constant in the perpendicular direction ($K_u$) is $5 \times 10^6$ [erg/cm³] or more.

It is also understood from Table 2 that the magnetization states illustrated in FIGS. 1A to 1C can be achieved in the magnetization free layer 10, when the saturation magnetization ($M_s$) is small, and the magnetic anisotropy constant in the perpendicular direction ($K_u$) is large. In particular, it is understood that the magnetization states illustrated in FIGS. 1A to 1C can be achieved when the saturation magnetization ($M_s$) is 800 [emu/cm³] or less and the magnetic anisotropy constant in the perpendicular direction ($K_u$) is $6 \times 10^6$ [erg/cm³] or more, when the saturation magnetization ($M_s$) is 600 [emu/cm³] or less and the magnetic anisotropy constant in the perpendicular direction ($K_u$) is $4 \times 10^6$ [erg/cm³] or more, or when the saturation magnetization ($M_s$) is 400 [emu/cm³] or less and the magnetic anisotropy constant in the perpendicular direction ($K_u$) is $2 \times 10^6$ [erg/cm³] or more.

Specific materials are exemplified below. First, materials of the magnetization free layer 10, the first magnetization fixed layer 30, and the second magnetization fixed layer 15 desirably include at least one material selected from Fe, Co, or Ni. Additional inclusion of Pt or Pd stabilizes the perpendicular magnetic anisotropy. In addition to these, addition of B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm, or the like provides an adjustment for achieving desired magnetic characteristics. For example, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, and the like are exemplified. Besides, the magnetic anisotropy in the perpendicular direction can be exhibited by stacking a layer including any one material selected from Fe, Co, or Ni and a different layer. Specifically, stacked films of Co/Pd, Co/Pt, Co/Ni and Fe/Au are exemplified.

The spacer layer 20 is desirably formed of insulating material. Specifically, Mg—O, Al—O, Al—N, Ni—O, Hf—O and the like is exemplified as material of the spacer layer 20. It should be noted that the present invention may be implemented also by using semiconductor or metal material, besides the insulating material. Specifically, Cr, Al, Cu, Zn, and the like are exemplified.

Second Exemplary Embodiment

Figure 12A:
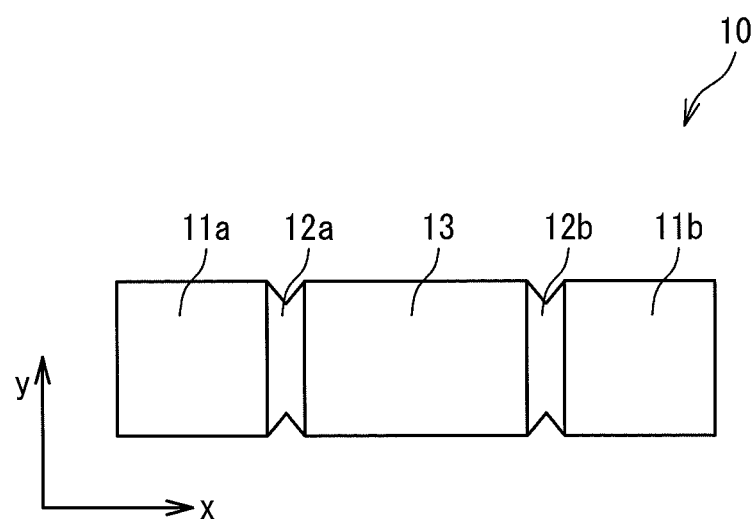
FIG. 12A is a plan view illustrating a structure of a main part of a magnetoresistance effect element in a second exemplary embodiment of the present invention.
Figure 12B:
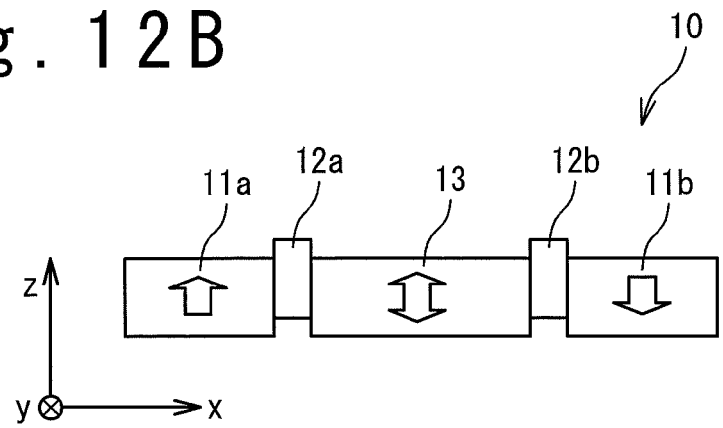
FIG. 12B is a cross-sectional view illustrating a structure of the main part of the magnetoresistance effect element in the second exemplary embodiment.

FIGS. 12A and 12B schematically illustrate structures of the magnetoresistance effect element 80 in a second exemplary embodiment of the present invention, in particular, structures of the magnetization free layer 10. The magnetoresistance effect element 80 of the second exemplary embodiment is related to domain wall pinning sites 12a and 12b in the magnetization free layer 10, and formed such that the domain wall pinning sites 12a and 12b bind the domain wall more strongly.

As illustrated in FIG. 12A, modulation of the planar shape in the x-y plane provides strong binding of the domain wall.

Figure 12C:
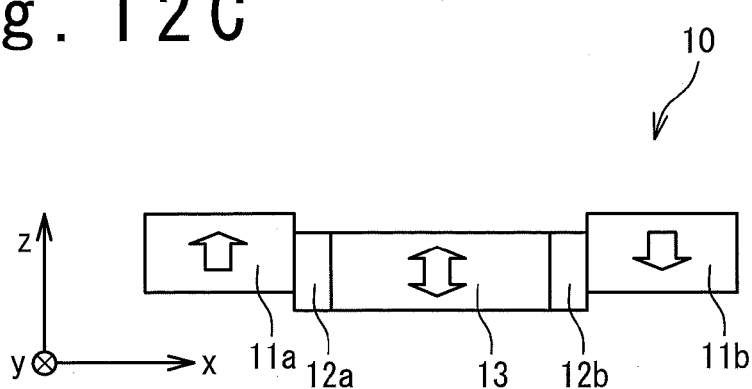
FIG. 12C is a cross-sectional view illustrating a structure of the main part of the magnetoresistance effect element in the second exemplary embodiment.
Figure 12D:
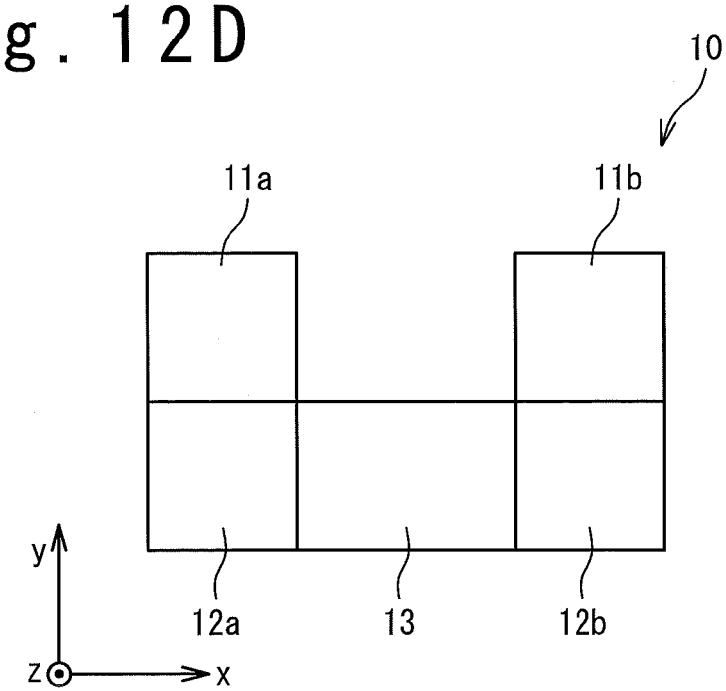
FIG. 12D is a plan view illustrating a structure of the main part of the magnetoresistance effect element in the second exemplary embodiment.
Figure 13A:
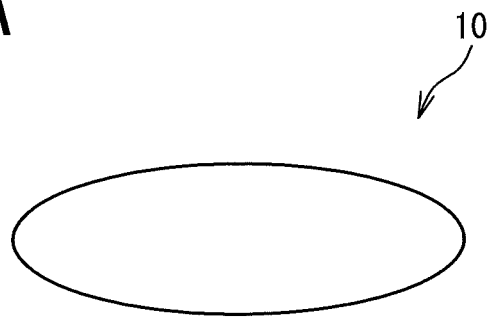
FIG. 13A is a plan view illustrating a structure of a main part of a magnetoresistance effect element in a third exemplary embodiment of the present invention.
Figure 13B:
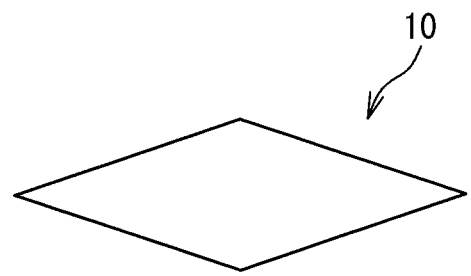
FIG. 13B is a plan view illustrating a structure of the main part of the magnetoresistance effect element in the third exemplary embodiment of the present invention.
Figure 13C:
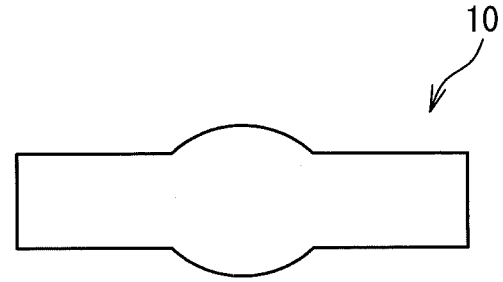
FIG. 13C is a plan view illustrating a structure of the main part of the magnetoresistance effect element in the third exemplary embodiment of the present invention.
Figure 13D:
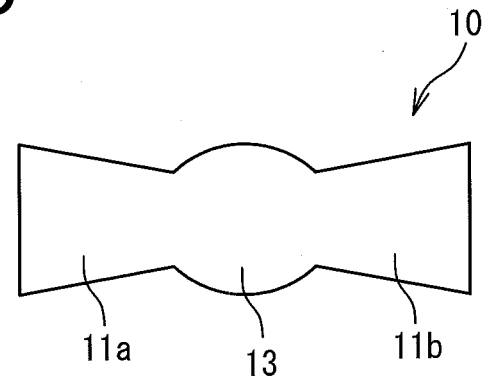
FIG. 13D is a plan view illustrating a structure of the main part of the magnetoresistance effect element in the third exemplary embodiment of the present invention.

Although FIG. 12A is an exemplary embodiment in which the magnetization free layer 10 is patterned with notches, projections or the like may be provided alternatively. Also, as illustrated in FIGS. 12B and 12C, modulation of the cross-sectional shape in the x-z cross-section provides strong binding of the domain wall at the domain wall pinning site 12a or 12b. As illustrated in FIG. 12C only a portion serving as the domain wall pinning site 12 may have a step, or as illustrated in FIG. 12C, a magnetization fixed portion 11 may be provided with a step. Further, as in FIG. 12D, displacement of the magnetization fixed portion 11 in the y-axis direction forms a binding portion of the domain wall.

Alternatively, although not illustrated, the domain wall may be bound also by changing magnetic characteristics of the domain wall pinning sites 12a and 12b with respect to those of the domain wall motion portion 13 or the magnetization fixed portion 11. Such change in magnetic characteristics may be also made by using a different material, or also by injecting a different element, or introducing defects or the like.

Third Exemplary Embodiment

FIGS. 13A to 13D schematically illustrate structures of the magnetoresistance effect element 80 in a third exemplary embodiment of the present invention, in particular structures of the magnetization free layer 10. The third exemplary embodiment is related to the shape of the magnetization free layer 10, and achieves notably stable binary states.

In the case of the perpendicular magnetization film, a state where the domain wall stops in the middle of the domain wall motion portion 13 is not so unstable. Such state, which is an intermediate state between "0" and "1", should be avoided. Meanwhile, the domain wall tends to move in a direction that decreases the area thereof as much as possible to reduce the energy of the entire system. Accordingly, when a portion at the middle of the domain wall motion portion 13 has a wider width than the other parts, the portion becomes unstable, and therefore the intermediate state described above is eliminated. Schematic diagrams illustrated in FIGS. 13A to 13D are all based on this concept. In addition, as in FIG. 13D, the domain wall passing through the domain wall pinning site 12a or 12b in the domain wall motion caused by the write current can be brought back to the pinning site for the domain wall when the current is switched off, by forming the magnetization fixed portions 11a and 11b so as to increase widths thereof towards both ends.

Fourth Exemplary Embodiment

Figure 14A:
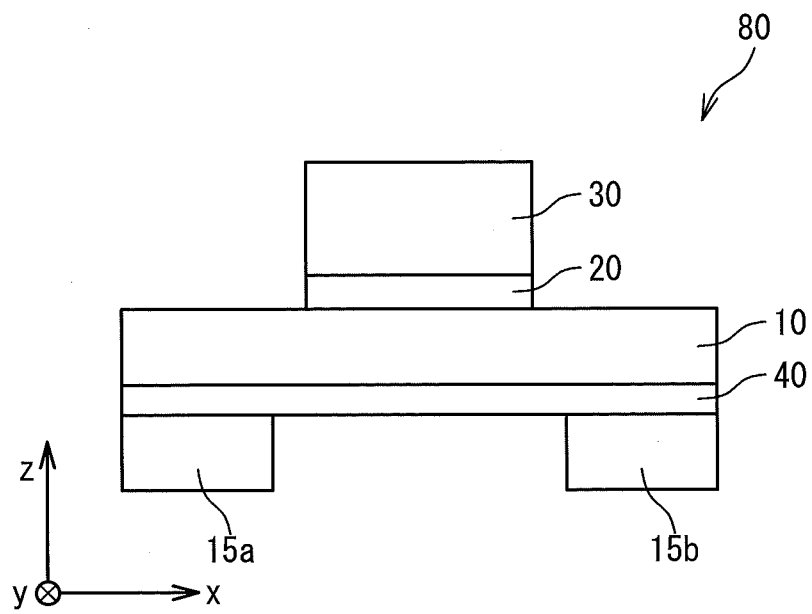
FIG. 14A is a cross-sectional view illustrating a structure of a main part of a magnetoresistance effect element in a fourth exemplary embodiment of the present invention.
Figure 14B:
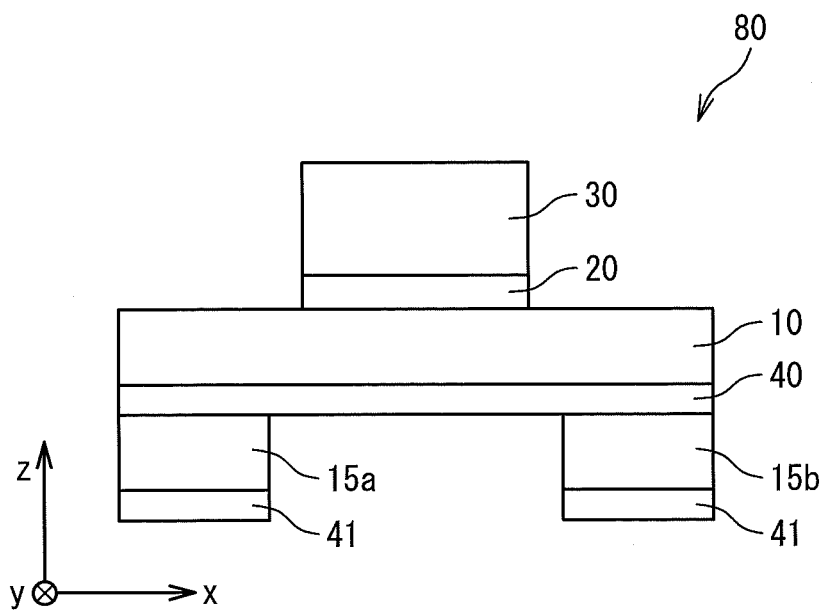
FIG. 14B is a cross-sectional view illustrating a structure of the main part of the magnetoresistance effect element in the fourth exemplary embodiment of the present invention.

FIGS. 14A and 14B schematically illustrate structures of the magnetoresistance effect element 80 in a fourth exemplary embodiment of the present invention. The fourth exemplary embodiment is related to underlying layers of the magnetization free layer 10 and the second magnetization fixed layer 15.

According to Journal of Magnetism and Magnetic Materials, vol. 247, pp. 153-158 (2002), there is described that, magnetic characteristics of a magnetic layer of perpendicular magnetic anisotropy material in the perpendicular direction is largely varied depending on the selection of the underlying layer of the magnetic layer. Accordingly, as in FIG. 14A, an underlying layer 40 may be provided under the magnetization free layer 10, or as illustrated in FIG. 14B, underlying layers 41 may be provided under the second magnetization fixed layers 15. Also, the underlying layers 40 and 41 may be a multilayered film including a plurality of films formed of different materials. The structure and texture of the underlying layers 40 and 41 are desirably controlled so as to develop a crystal easy magnetization axis of the magnetic layer deposited on the underlying layer in a desired direction.

As material for the underlying layers 40 and 41, in addition to Ti, Zr, Nb, Mo, Hf, Ta, W, Ru, Rh, Pd, Os, Ir, Pt, or the like, an oxide or nitride thereof, Co—Cr—Pt—Ta, or the like may be used.

It should be note that the underlying layer 40 of the magnetization free layer 10 desirably has a relatively high electrical resistance as compared with material used for the magnetization free layer 10. This aims to reduce a shunt current into the underlying layer 40 from the write current. This may be achieved by sufficiently decreasing the film thickness of the underlying layer 40 as compared with the magnetization free layer 10, or by selecting as the underlying layer 40 material having a resistivity sufficiently larger than that of the material used for the magnetization free layer 10.

It is particularly preferable that the underlying layer 40 is formed of material having a magnetic moment (i.e., magnetic material). This is because magnetic coupling can be strongly achieved through the underlying layer 40 between the magnetization free layer 10 and the second magnetization fixed layer 15. Above-described Co—Cr—Pt—Ta is preferable in this aspect.

Fifth Exemplary Embodiment

Figure 15:
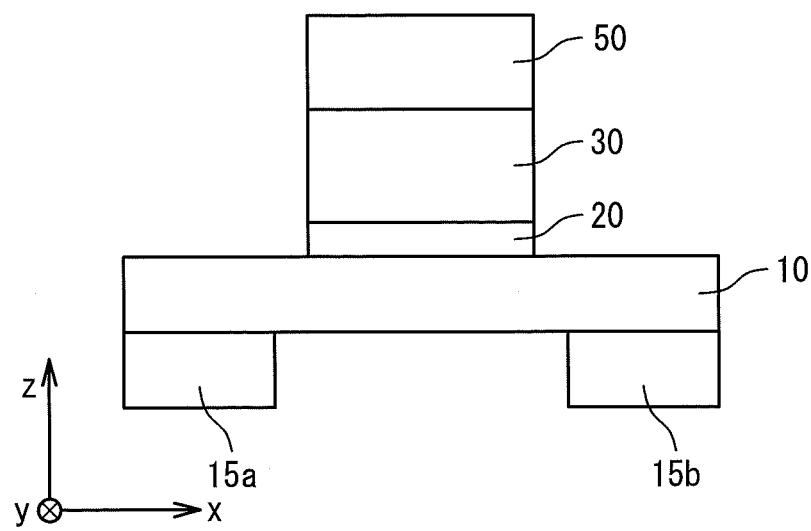
FIG. 15 is a cross-sectional view illustrating a structure of a main part of a magnetoresistance effect element in a fifth exemplary embodiment of the present invention.

FIG. 15 schematically illustrates a structure of the magnetoresistance effect element 80 in a fifth exemplary embodiment of the present invention. In the fifth exemplary embodiment, the pinning layer 50 is provided adjacent to the first magnetization fixed layer 30 in order to stably fix magnetization of the first magnetization fixed layer 30. It should be note that, in FIG. 15, the pinning layer 50 is provided so as to be in contact with the surface of the first magnetization fixed layer 30 on the side opposite to the spacer layer 20; however, the pinning layer 50 is only required to be in contact with the first magnetization fixed layer 30, and therefore the position thereof may be arbitrarily selected.

Antiferromagnetic material or the like may be used as material of the pinning layer 50. Specifically, Pt—Mn, Ir—Mn, Fe—Mn, Ni—Mn, Mn—Rh, and the like are exemplified.

Sixth Exemplary Embodiment

Figure 16:
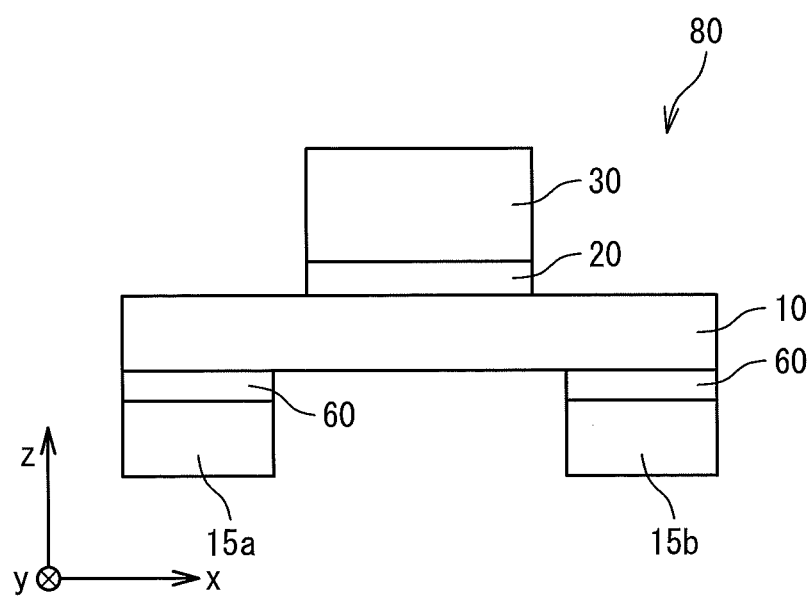
FIG. 16 is a cross-sectional view illustrating a structure of a main part of a magnetoresistance effect element in a sixth exemplary embodiment of the present invention.

FIG. 16 schematically illustrates a structure of the magnetoresistance effect element in a sixth exemplary embodiment of the present invention. In the sixth exemplary embodiment, a high polarizability layer 60 is inserted into at least a part of the interfaces between the magnetization free layer 10 and the second magnetization fixed layers 15.

The spin polarizability of conduction electrons flowing through magnetic material is desirably as high as possible in the current-driven domain wall motion using the spin torque term. In this exemplary embodiment, the high polarizability layer 60 is formed of high spin polarizability material to thereby increase the spin polarizability of the conduction electrons. This allows reduction in the write current and increase in the writing speed.

It should be noted that material having a perpendicular magnetic anisotropy may be used as a material for the high polarizability layer 60; however, even in the case of material having a magnetic anisotropy in the in-plane direction, the material can be magnetized in the film surface perpendicular direction due to the magnetic interaction with the second magnetization fixed layer 15 or the magnetization free layer 10 if the film thickness of the material is sufficiently thin; the magnetization state of the system is not disturbed. Specifically, Co, Fe, Co—Fe, and the like are exemplified, and an adjustment may be made to obtain desired characteristics by adding other elements.

Seventh Exemplary Embodiment

Figure 17:
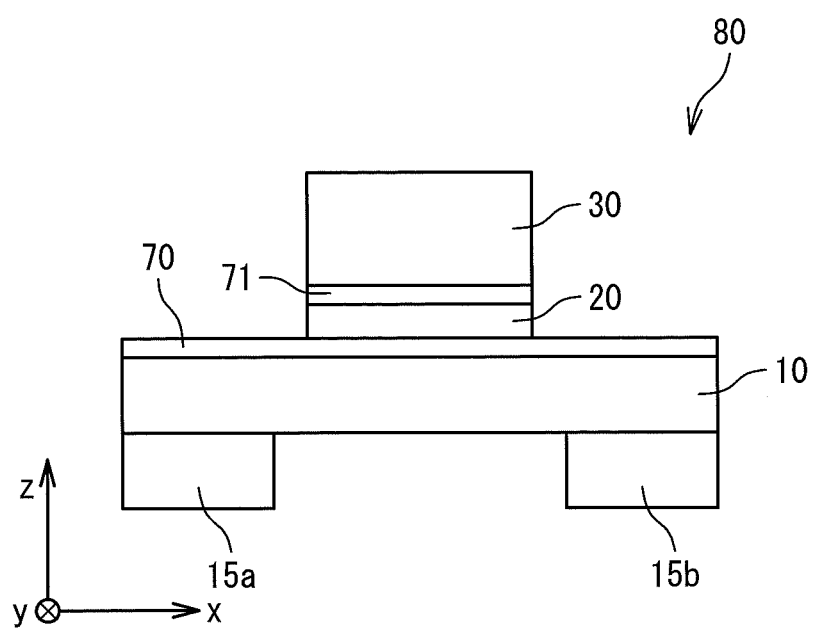
FIG. 17 is a cross-sectional view illustrating a structure of a main part of a magnetoresistance effect element in a seventh exemplary embodiment of the present invention.

FIG. 17 schematically illustrates a structure of the magnetoresistance effect element 80 in a seventh exemplary embodiment of the present invention. In the seventh exemplary embodiment, a high polarizability layer 70 or 71 is inserted into at least a part of the interface between the spacer layer 20, and the magnetization free layer 10 or the first magnetization fixed layer 30.

In the present invention, which uses the magnetoresistance effect to read information, a higher magnetoresistance effect ratio is obtained and therefore a larger read signal is obtained as spin polarizabilities of the magnetization free layer 10 serving as the information memory layer and the first magnetization fixed layer 30 serving as the reference layer are increased. In this modification, the apparent spin polarizabilities of the magnetization free layer 10 and the first magnetization fixed layer 30, which influence the magnetoresistance effect, can be increased by inserting the high polarizability layer 70 or 71 into the interface with the spacer layer 20, and as a result, a high magnetoresistance effect ratio is obtained.

It should be note that material having a perpendicular magnetic anisotropy may be used as material for the high polarizability layer 70 and 71; however, the material can be magnetized in the film surface perpendicular direction due to the magnetic interaction with the first magnetization fixed layer 30 or the magnetization free layer 10 even in material having a magnetic anisotropy in the in-plane direction, if a film thickness of the material is sufficiently thin; the magnetization state of the system is not disturbed. As material specifically used, Co, Fe, Co—Fe, and the like are exemplified, and an adjustment may be made to obtain desired characteristics by adding other elements.

Further, the high polarizability layer 70 serving as an under layer for growth of the spacer layer 20 can also serve as a control layer that controls the crystal orientation of a specific spacer layer 20 in FIG. 17, depending on the selection of material used therefor. For example, in recent years, there is reported that the use of MgO having a (001) orientation as the insulating layer in a tunnel magnetic junction provides a very large magnetoresistance effect ratio, and the (001) orientation of MgO can be achieved by using, for example, Co—Fe—B as the high polarizability layer 70.

Eighth Exemplary Embodiment

Figure 18A:
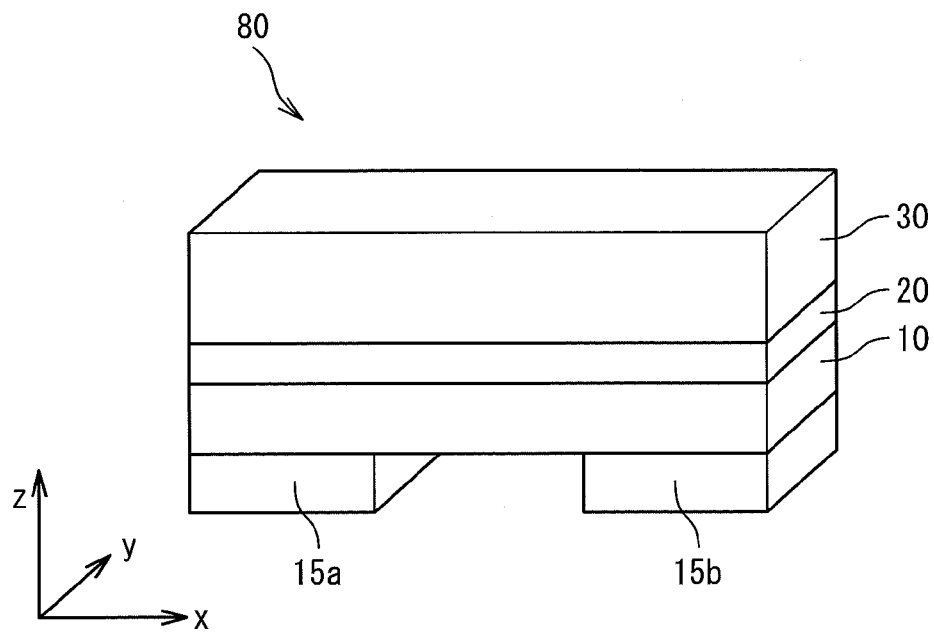
FIG. 18A is a perspective view illustrating a structure of a main part of a magnetoresistance effect element in an eighth exemplary embodiment of the present invention.
Figure 18B:
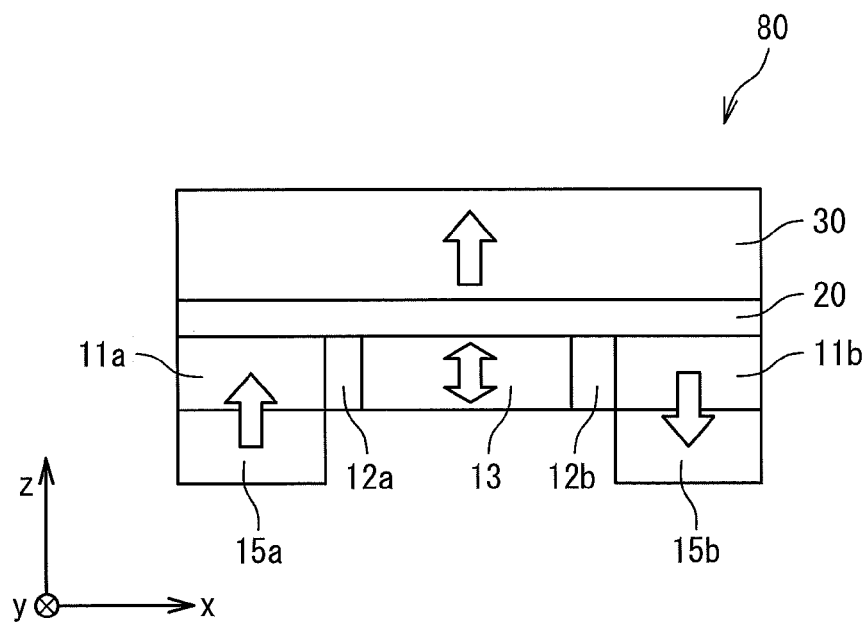
FIG. 18B is a cross-sectional view illustrating the structure of the main part of the magnetoresistance effect element in the eighth exemplary embodiment of the present invention.

FIGS. 18A and 18B schematically illustrate a structure of the magnetoresistance effect element 80 in an eighth exemplary embodiment of the present invention. FIG. 18A is a perspective view of the magnetoresistance effect element 80 in the eighth exemplary embodiment, and FIG. 18B is an x-y cross-sectional view. In the eighth exemplary embodiment, a surface of at least a portion of the magnetization free layer 10 other than portions in contact with second magnetization fixed layers 15 is connected to the first magnetization fixed layer 30 through the spacer layer 20.

In the above-described exemplary embodiments, a current is directly flowed through the magnetization free layer 10 in data writing; however, operational instability, or reduction in lifetime of the element is concerned at this time due to heat generation in the magnetization free layer 10. When the magnetization free layer 10 is in contact with high thermal conductivity material at as many surfaces as possible, heat radiation is facilitated, and therefore the influence of the heat generation can be reduced. It should be note that the whole of the surface of the magnetization free layer 10, which is on the side opposite to the surface in contact with the second magnetization fixed layer 15, is in contact with the first magnetization fixed layer 30 through the spacer layer 20 in FIGS. 18A and 18B; however, the shapes and arrangements of the spacer layer 20 and the first magnetization fixed layer 30 may be arbitrarily selected.

Ninth Exemplary Embodiment

Figure 19A:
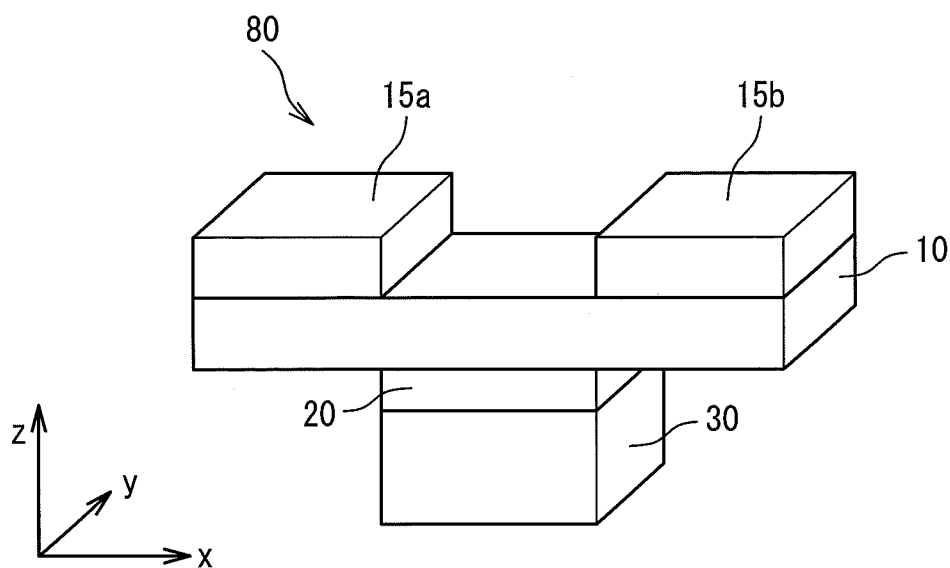
FIG. 19A is a perspective view illustrating a structure of a main part of a magnetoresistance effect element in a ninth exemplary embodiment of the present invention.
Figure 19B:
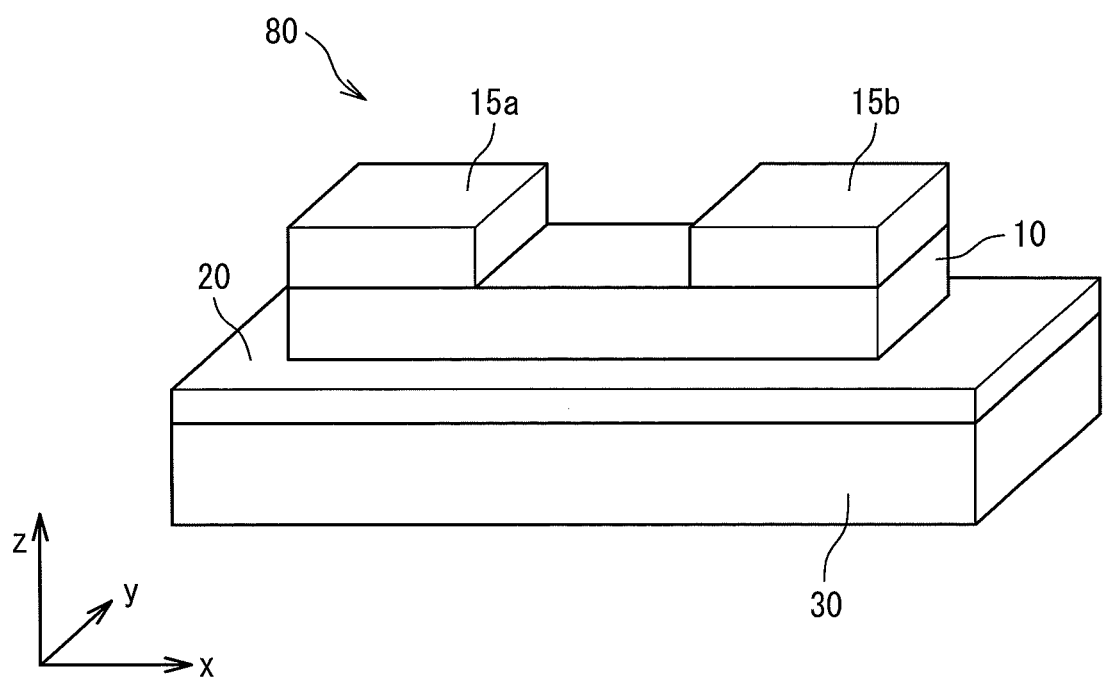
FIG. 19B is a perspective view illustrating a structure of the main part of the magnetoresistance effect element in the ninth exemplary embodiment of the present invention.

FIGS. 19A and 19B schematically illustrate structures of the magnetoresistance effect element 80 in a ninth exemplary embodiment of the present invention. The ninth exemplary embodiment is related to the layer stacking order of the magnetization free layer 10, the spacer layer 20, and the first magnetization fixed layer 30. Although the magnetization free layer 10 is arranged closer to a substrate 110 than the first magnetization fixed layer 30 in FIG. 10, the first magnetization fixed layer 30 is arranged closer to a substrate than the magnetization free layer 10 in this exemplary embodiment.

Also, although the structure of FIG. 19A is just the reversed structure of FIG. 1, the magnetization free layer 10 may be formed to be accommodated within the first magnetization fixed layer 30 in terms of the x-y planar shape as shown in FIG. 19B in this exemplary embodiment. The use of the structure as in FIG. 19B reduces the influence of magnetic flux from the first magnetization fixed layer 30 to the magnetization free layer 10 in addition to the influence of heat generation as described in the eighth exemplary embodiment.

Tenth Exemplary Embodiment

Figure 20A:
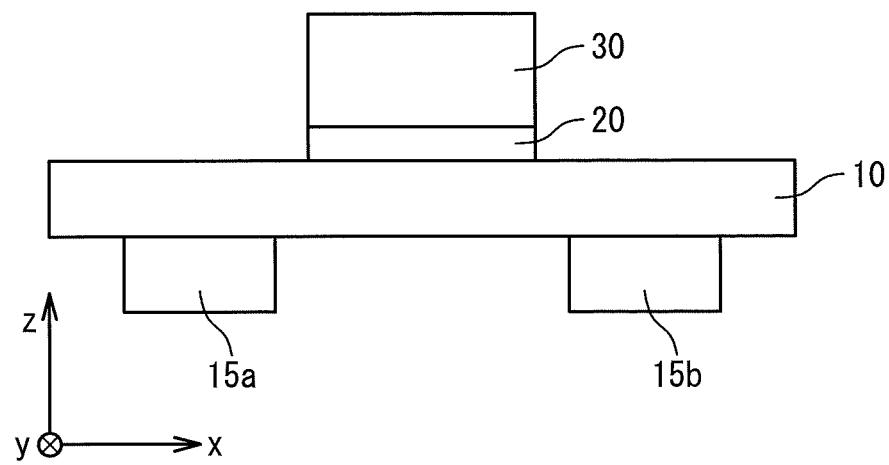
FIG. 20A is a cross-sectional view illustrating a structure of a main part of a magnetoresistance effect element in a tenth exemplary embodiment of the present invention.
Figure 20B:
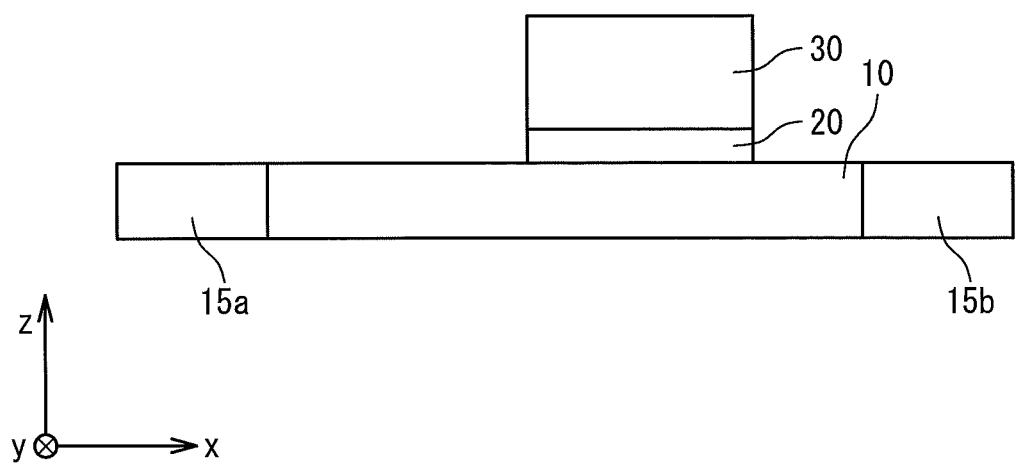
FIG. 20B is a cross-sectional view illustrating a structure of the main part of the magnetoresistance effect element in the tenth exemplary embodiment of the present invention.
Figure 20C:
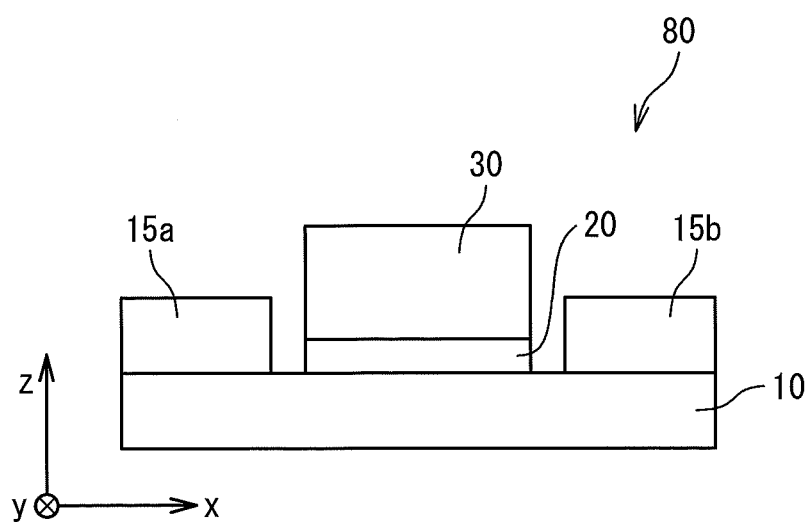
FIG. 20C is a cross-sectional view illustrating a structure of the main part of the magnetoresistance effect element in the tenth exemplary embodiment of the present invention.

FIGS. 20A to 20C schematically illustrate structures of the magnetoresistance effect element 80 in a tenth exemplary embodiment of the present invention. The tenth exemplary embodiment is related to positions of the second magnetization fixed layers 15*a* and 15*b*.

Although the second magnetization fixed layers 15*a* and 15*b* are provided in contact with the both ends of the magnetization free layer 10 on the surface opposite to the spacer layer 20 in FIG. 1C, the second magnetization fixed layers 15*a* and 15*b* are only required to be in contact with vicinities of the both ends of the magnetization free layer 10; the positions thereof may be arbitrarily selected. For example, as in FIG. 20A, the second magnetization fixed layers 15*a* and 15*b* may be arranged at positions that are slightly displaced inward from both ends of the magnetization free layer 10, or as in FIG. 20B, laterally arranged in the same plane as the magnetization free layer 10, or as in FIG. 20C, arranged on the same surface as that in contact with the spacer layer 20 with respect to the magnetization free layer 10. Also, in the case where the second magnetization fixed layers 15 are formed on the same plane as the magnetization free layer 10 as in FIG. 20B, the second magnetization fixed layers 15 may be provided adjacent to the magnetization free layer 10 in the x-direction, or in the y-direction, i.e., adjacent in the front/back direction of the drawing.

Also, in the case where the second magnetization fixed layers 15*a* and 15*b* are arranged at positions slightly displaced inward from the both ends of the magnetization free layer 10 as in FIG. 20A, the original magnetization state remains in the regions of the magnetization free layer 10 outside the positions in contact with the second magnetization fixed layers 15, even when the domain wall exceeds the domain wall pinning site 12 in writing. Accordingly, the normal state, i.e., any of the states of FIGS. 2A and 2B, can be restored when the write current is switched off. The structure as in FIG. 20A is expected to produce a larger effect by, for example, using together with the planar shape illustrated in FIG. 13D.

As above, the present invention has been described referring to the exemplary embodiments; however, the present invention is not limited to any of the above-described exemplary embodiments. Various modifications one skilled in the art would appreciate within the scope of the present invention may be made to the configurations and details of the present invention. In particular, it should be noted that two or more of the first to tenth exemplary embodiments may be simultaneously applied to one magnetoresistance effect element when no technical contradiction occurs.

The invention claimed is:

1. A magnetoresistance effect element, comprising:
a magnetization free layer;
a spacer layer provided adjacent to said magnetization free layer;
a first magnetization fixed layer provided adjacent to said spacer layer on a side opposite to said magnetization free layer; and
at least two second magnetization fixed layers provided adjacent to said magnetization free layer,
wherein said magnetization free layer, said first magnetization fixed layer, and said at least two second magnetization fixed layers respectively have magnetization components in a direction substantially perpendicular to film surfaces thereof,
wherein said magnetization free layer includes:
two magnetization fixed portions; and
a domain wall motion portion arranged between said two magnetization fixed portions,
wherein one of said two magnetization fixed portions is adjacent to one of said at least two second magnetization fixed layers,
wherein the other of said two magnetization fixed portions is adjacent to another of said at least two second magnetization fixed layers,
wherein magnetizations of said two magnetization fixed portions constituting said magnetization free layer are fixed substantially antiparallel to each other in directions substantially perpendicular to the film surface thereof,
wherein said domain wall motion portion is provided with magnetic anisotropy in a direction perpendicular to the film surface, and
wherein said at least two second magnetization fixed layers have coercive fields different from each other.

2. The magnetoresistance effect element according to claim 1, wherein a write current is supplied to said magnetization free layer through the second magnetization fixed layers in writing information into said magnetoresistance effect element.

3. The magnetoresistance effect element according to claim 1, wherein a film thickness of said magnetization free layer ranges from 1 nm to 20 nm.

4. The magnetoresistance effect element according to claim 1, wherein a film thickness of said magnetization free layer ranges from 1 nm to 10 nm.

5. The magnetoresistance effect element according to claim 1, wherein a film thickness of said magnetization free layer ranges from 1 nm to 8 nm.

6. The magnetoresistance effect element according to claim 1, wherein said at least two second magnetization fixed layers are formed of different materials from each other.

7. The magnetoresistance effect element according to claim 1, wherein easy magnetization axes of said at least two second magnetization fixed layers are directed in directions different from each other.

8. The magnetoresistance effect element according to claim 1, said at least two second magnetization fixed layers are formed with thicknesses different from each other.

9. The magnetoresistance effect element according to claim 1, wherein a pinning layer is provided adjacent to at least one of said at least two second magnetization fixed layers.

10. The magnetoresistance effect element according to claim 1, wherein said at least two second magnetization fixed layers are formed with sizes different from each other.

11. The magnetoresistance effect element according to claim 3, wherein at least one of said magnetization free layer, said first magnetization fixed layer and said at least two second magnetization fixed layers are formed of material having a perpendicular crystalline magnetic anisotropy.

12. The magnetoresistance effect element according to claim 11, wherein said magnetization free layer is formed with material having a saturation magnetization of 800 [emu/cm$^3$] or less, and a magnetic anisotropy constant of $6\times10^6$ [erg/cm$^3$] or more.

13. The magnetoresistance effect element according to claim 11, wherein said magnetization free layer is formed with material having a saturation magnetization of 600 [emu/cm$^3$] or less, and a magnetic anisotropy constant of $4\times10^6$ [erg/cm$^3$] or more.

14. The magnetoresistance effect element according to claim 11, wherein said magnetization free layer is formed with material having a saturation magnetization of 400 [emu/cm$^3$] or less, and a magnetic anisotropy constant of $2\times10^6$ [erg/cm$^3$] or more.

15. The magnetoresistance effect element according to claim 11, wherein said at least two second magnetization fixed layers are formed with material having a saturation magnetization of 1200 [emu/cm$^3$] or less, and a magnetic anisotropy constant of $1\times10^7$ [erg/cm$^3$] or more.

16. The magnetoresistance effect element according to claim 11, wherein said at least two second magnetization fixed layers are formed with material having a saturation magnetization of 800 [emu/cm$^3$] or less, and a magnetic anisotropy constant of $5\times10^6$ [erg/cm$^3$] or more.

17. The magnetoresistance effect element according to claim 3, wherein at least one of said magnetization free layer, said first magnetization fixed layer and said at least two second magnetization fixed layers are formed of a film stack comprising at least two layers including a ferromagnetic layer.

18. The magnetoresistance effect element according to claim 3, wherein a high polarizability layer is provided on at least a portion of an interface between said magnetization free layer and said at least two second magnetization fixed layers.

19. The magnetoresistance effect element according to claim 3, wherein a high polarizability layer is provided on at least a portion of an interface between said magnetization free layer and said spacer layer or an interface between said first magnetization fixed layer and said spacer layer.

20. The magnetoresistance effect element according to claim 3, wherein a control layer is provided of a face of said spacer layer.

21. The magnetoresistance effect element according to claim 3, wherein an outer edge of said first magnetization fixed layer is substantially aligned to or positioned outside of an outer edge of said magnetization free layer.

22. The magnetoresistance effect element according to claim 3, wherein said at least two second magnetization fixed layers are connected to said magnetization free layer inside an edge of said magnetization free layer.

23. The magnetoresistance effect element according to claim 3, wherein an under layer is provided adjacent to said magnetization free layer on a side near a substrate.

24. A magnetoresistance effect element, comprising:
a magnetization free layer;
a spacer layer provided adjacent to said magnetization free layer;
a first magnetization fixed layer provided adjacent to said spacer layer on a side opposite to said magnetization free layer; and
at least two second magnetization fixed layers provided adjacent to said magnetization free layer,
wherein said magnetization free layer, said first magnetization fixed layer, and said at least two second magnetization fixed layers respectively have magnetization components in a direction substantially perpendicular to film surfaces thereof,
wherein said magnetization free layer includes:
two magnetization fixed portions; and
a domain wall motion portion arranged between said two magnetization fixed portions,
wherein one of said two magnetization fixed portions is adjacent to one of said at least two second magnetization fixed layers,
wherein the other of said two magnetization fixed portions is adjacent to another of said at least two second magnetization fixed layers,
wherein magnetizations of said two magnetization fixed portions constituting said magnetization free layer are fixed substantially antiparallel to each other in directions substantially perpendicular to the film surface thereof,
wherein said domain wall motion portion is provided with magnetic anisotropy in a direction perpendicular to the film surface, and
wherein said at least two second magnetization fixed layers are formed in shapes different from each other.

25. The magnetoresistance effect element according to claim 24, wherein at least one of said magnetization free layer, said first magnetization fixed layer and said at least two second magnetization fixed layers are formed of material having a perpendicular crystalline magnetic anisotropy.

26. The magnetoresistance effect element according to claim 25, wherein said magnetization free layer is formed with material having a saturation magnetization of 800 [emu/cm$^3$] or less, and a magnetic anisotropy constant of $6\times10^6$ [erg/cm$^3$] or more.

27. The magnetoresistance effect element according to claim 25, wherein said magnetization free layer is formed with material having a saturation magnetization of 600 [emu/cm$^3$] or less, and a magnetic anisotropy constant of $4\times10^6$ [erg/cm$^3$] or more.

28. The magnetoresistance effect element according to claim 25, wherein said magnetization free layer is formed with material having a saturation magnetization of 400 [emu/cm$^3$] or less, and a magnetic anisotropy constant of $2\times10^6$ [erg/cm$^3$] or more.

29. The magnetoresistance effect element according to claim 25, wherein said at least two second magnetization fixed layers are formed with material having a saturation magnetization of 1200 [emu/cm$^3$] or less, and a magnetic anisotropy constant of $1\times10^7$ [erg/cm$^3$] or more.

30. The magnetoresistance effect element according to claim 25, wherein said at least two second magnetization fixed layers are formed with material having a saturation magnetization of 800 [emu/cm$^3$] or less, and a magnetic anisotropy constant of $5\times10^6$ [erg/cm$^3$] or more.

31. The magnetoresistance effect element according to claim 24, wherein at least one of said magnetization free layer, said first magnetization fixed layer and said at least two second magnetization fixed layers are formed of a film stack comprising at least two layers including a ferromagnetic layer.

32. The magnetoresistance effect element according to claim 24, wherein a high polarizability layer is provided on at least a portion of an interface between said magnetization free layer and said at least two second magnetization fixed layers.

33. The magnetoresistance effect element according to claim 24, wherein a high polarizability layer is provided on at least a portion of an interface between said magnetization free layer and said spacer layer or an interface between said first magnetization fixed layer and said spacer layer.

34. The magnetoresistance effect element according to claim 24, wherein a control layer is provided of a face of said spacer layer.

35. The magnetoresistance effect element according to claim 24, wherein an outer edge of said first magnetization fixed layer is substantially aligned to or positioned outside of an outer edge of said magnetization free layer.

36. The magnetoresistance effect element according to claim 24, wherein said at least two second magnetization fixed layers are connected to said magnetization free layer inside an edge of said magnetization free layer.

37. The magnetoresistance effect element according to claim 24, wherein an under layer is provided adjacent to said magnetization free layer on a side near a substrate.

38. A magnetic random access memory, comprising:
a memory provided with a magnetoresistance effect element including:
a magnetization free layer;
a spacer layer provided adjacent to said magnetization free layer;
a first magnetization fixed layer provided adjacent to said spacer layer on a side opposite to said magnetization free layer; and
at least two second magnetization fixed layers provided adjacent to said magnetization free layer,
wherein said magnetization free layer, said first magnetization fixed layer, and said at least two second magnetization fixed layers respectively have magnetization components in a direction substantially perpendicular to film surfaces thereof,
wherein said magnetization free layer includes:
two magnetization fixed portions; and
a domain wall motion portion arranged between said two magnetization fixed portions,
wherein one of said two magnetization fixed portions is adjacent to one of said at least two second magnetization fixed layers,
wherein the other of said two magnetization fixed portions is adjacent to another of said at least two second magnetization fixed layers,
wherein magnetizations of said two magnetization fixed portions constituting said magnetization free layer are fixed substantially antiparallel to each other in directions substantially perpendicular to the film surface thereof,
wherein said domain wall motion portion is provided with magnetic anisotropy in a direction perpendicular to the film surface, and
wherein said at least two second magnetization fixed layers have coercive fields different from each other.

* * * * *